US012810912B2

(12) United States Patent
Song et al.

(10) Patent No.: US 12,810,912 B2
(45) Date of Patent: Nov. 24, 2026

(54) RACETRACK MEMORY DEVICE

(71) Applicant: Samsung Electronics Co., Ltd., Suwon-si (KR)

(72) Inventors: Kyungmee Song, Suwon-si (KR); Seungjae Lee, Suwon-si (KR); Unghwan Pi, Suwon-si (KR); Soichiro Mizusaki, Suwon-si (KR); Atsushi Okada, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 18/760,609

(22) Filed: Jul. 1, 2024

(65) Prior Publication Data

US 2025/0232790 A1 Jul. 17, 2025

(51) Int. Cl.
*G11C 11/16* (2006.01)
*G11C 19/08* (2006.01)

(52) U.S. Cl.
CPC ........ *G11C 11/161* (2013.01); *G11C 19/0808* (2013.01)

(58) Field of Classification Search
CPC .............. G11C 11/161; G11C 19/0808; G11C 11/1659; G11C 11/1673; G11C 11/18; G11C 19/0841; G11C 11/1675; G11C 11/02; G11C 11/14
See application file for complete search history.

(56) References Cited

U.S. PATENT DOCUMENTS

| | | | |
|---|---|---|---|
| 6,834,005 | B1 | 12/2004 | Parkin |
| 7,551,469 | B1 | 6/2009 | Parkin |
| 7,864,556 | B2 | 1/2011 | Lim et al. |
| 7,952,905 | B2 | 5/2011 | Hwang et al. |
| 8,331,125 | B2 | 12/2012 | DeBrosse |
| 2006/0120132 | A1 | 6/2006 | Parkin |

(Continued)

FOREIGN PATENT DOCUMENTS

| | | | |
|---|---|---|---|
| CN | 111540395 | B | 11/2022 |
| KR | 10-0829576 | B1 | 5/2008 |

OTHER PUBLICATIONS

Ales Hrabec. Domain wall dynamics in magnetic nanostructures: Effect of magnetic field and electric current. Materials Science [cond-mat.mtrl-sci]. Université de Grenoble, 2011. English. NNT: 2011GRENY056. tel-00767418 (Year: 2011).*

(Continued)

*Primary Examiner* — Jerome Leboeuf

(74) *Attorney, Agent, or Firm* — Harness, Dickey & Pierce, P.L.C.

(57) ABSTRACT

A racetrack memory device may include a writing element extending in a first horizontal direction and configured to create a magnetic domain based on a first current applied to the writing element, a moving element having a first end connected to the writing element and extending in a second horizontal direction intersecting the first horizontal direction, the moving element configured to have the magnetic domain created in the writing element being injected into the moving element based on a second current applied to the moving element, and a reading element on the moving element and configured to read a magnetic domain included in the moving element. A width of the moving element may be less than a width of the writing element.

20 Claims, 23 Drawing Sheets

(56) References Cited

U.S. PATENT DOCUMENTS

| | | | | |
|---|---|---|---|---|
| 2010/0172169 | A1 | 7/2010 | Lee et al. | |
| 2015/0078070 | A1* | 3/2015 | Quinsat | G11C 11/1653 365/158 |
| 2015/0078071 | A1* | 3/2015 | Nakamura | G11C 11/161 365/158 |
| 2018/0269381 | A1* | 9/2018 | Quinsat | H10N 50/10 |
| 2021/0249061 | A1* | 8/2021 | Arnaud Quinsat | G11C 19/0841 |
| 2021/0367143 | A1 | 11/2021 | Lee et al. | |

OTHER PUBLICATIONS

Extended European Search Report dated Feb. 20, 2025 for corresponding European Patent Application No. 24199260.1.

Fan Chen et al., "Process variation aware data management for magnetic skyrmions racetrack memory," 2018 23rd Asia and South Pacific Design Automation Conference (ASP-DAC), Jeju, Korea (South), 2018, pp. 221-226, doi: 10.1109/ASPDAC.2018.8297309.

A. V. Khvalkovskiy et al., "Matching domain-wall configuration and spin-orbit torques for efficient domain-wall motion", Physical Review B, 87(2). (2013).

Wanjun Jiang et al., "Blowing magnetic skyrmion Bubbles", Science, 349(6245), 283-286. (2015) doi: 10.1126/science.aaa1442.

Soogil Lee et al., "Spintronic Physical Unclonable Functions Based on Field-Free Spin-Orbit-Torque Switching", Adv. Mater. 2022, 34, 2203558, DOI: 10.1002/adma.202203558.

K. Garello et al., "Manufacturable 300mm platform solution for Field-Free Switching SOT-MRAM", 2019 Symposium on VLSI Circuits. (2019) pp. T194-T195.

Vélez, S., Schaab, J., Wornle, M.S. et al. High-speed domain wall racetracks in a magnetic insulator. Nat Commun 10, 4750 (2019). https://doi.org/10.1038/s41467-019-12676-7.

Vaishnavi Kateel et al., "Field-Free Spin?Orbit Torque Driven Switching of Perpendicular Magnetic Tunnel Junction through Bending Current", Nano Lett., 23, 5482-5489. (2023).

Delin Zhang et al., "Bipolar Electric-Field Switching of Perpendicular Magnetic Tunnel Junctions through Voltage-Controlled Exchange Coupling", Nano Lett., 22, 622-629. (2022).

* cited by examiner

5bit image graph Intensity

RACETRACK MEMORY DEVICE

CROSS-REFERENCE TO RELATED APPLICATION

This application claims the benefit of Korean Patent Application No. 10-2024-005031, filed on Jan. 11, 2024, in the Korean Intellectual Property Office, the disclosure of which is incorporated herein in its entirety by reference.

BACKGROUND

1. Field

The disclosure relates to a magnetic memory device, and more particularly, to a racetrack memory device.

2. Description of the Related Art

Racetrack memory devices may use a magnetic domain as a memory unit and may store information as 1 and 0 depending on the direction of the magnetic domain. In a racetrack device, it is characteristic that a direction in which the magnetic domain within a racetrack moves changes depending on a direction in which a current flows. As the movement speed of the magnetic domain is very fast and the size of the magnetic domain is small, the racetrack device is attracting attention as an ultra-fast, high-capacity memory device.

A racetrack memory device may include a writing element, a moving element, and a reading element. In order to drive a racetrack memory device with high density and low power consumption, there is a need to record a magnetic domain with small energy or control the size of a magnetic domain.

SUMMARY

Provided is a racetrack memory device in which a writing element that creates a magnetic domain and a moving element that moves a magnetic domain are spatially separated from each other.

Provided is a racetrack memory device that may create a magnetic domain without an external magnetic field.

Provided is a racetrack memory device that may move a magnetic domain without an external magnetic field.

Additional aspects will be set forth in part in the description which follows and, in part, will be apparent from the description, or may be learned by practice of the presented embodiments.

According to an example embodiment of the disclosure, a racetrack memory device may include a writing element extending in a first horizontal direction and configured to create a magnetic domain based on a first current applied to the writing element; a moving element having a first end connected to the writing element, the moving element extending in a second horizontal direction, the second horizontal direction intersecting the first horizontal direction, the moving element configured to have the magnetic domain created in the writing element injected into the moving element based on a second current applied to the moving element; and a reading element on the moving element and configured to read a magnetic domain included in the moving element. A width of the moving element may be less than a width of the writing element.

In some embodiments, a ratio of the width of the writing element to the width of the moving element may be 1.5 or more.

In some embodiments, the ratio of the width of the writing element to the width of the moving element may be 5 or less.

In some embodiments, the ratio of the length of the writing element to the width of the moving element may be 2 or more.

In some embodiments, the writing element may be configured to create a magnetic domain having a magnetization direction corresponding to the direction of the first current.

In some embodiments, the writing element may be configured to create the magnetic domain so the magnetic domain has a first magnetization direction if a direction of the first current applied to the writing element is parallel to the first horizontal direction, and the writing element may be configured to create the magnetic domain so the magnetic domain has a second magnetization direction if the direction of the first current applied to the writing element is opposite the first horizontal direction. The second magnetization direction may be opposite the first magnetization direction.

In some embodiments, if a first magnetic domain having the first magnetization direction is already in the writing element, the writing element may be configured to change the magnetic domain in the writing element from the first magnetic domain to a second magnetic domain having the second magnetization direction if the direction of the first current applied to the writing element is opposite the first horizontal direction.

In some embodiments, a size of the magnetic domain injected into the moving element may be based on the pulse width of the second current.

In some embodiments, the size of the magnetic domain injected into the moving element may be proportional to the pulse width of the second current.

In some embodiments, the intensity of the second current may be less than or equal to the intensity of the first current.

In some embodiments, the intensity of the second current may be ⅓ or less of the intensity of the first current.

In some embodiments, the pulse width of the first current and the pulse width of the second current may be equal.

In some embodiments, the racetrack memory device may further include a first electrode at a first end of the writing element; a second electrode at a second end of the writing element, the second end of the writing element being opposite the first end of the writing element; and a third electrode connected to a second end of the moving element, the second end of the moving element being different than the first end of the moving element.

In some embodiments, the racetrack memory device may be configured to apply the first current through the first electrode and the second electrode, and the racetrack memory device may be configured to apply the second current through the third electrode while the first electrode and the second electrode are grounded.

In some embodiments, the writing element may include a first spin-orbit torque layer configured to induce a first spin orbit torque based on the first current, a first free layer on the first spin-orbit torque layer and configured to create the magnetic domain based on the first spin orbit torque, a first oxide layer on the first free layer, an insulating layer on the first oxide layer, and a magnetic hard mask configured to form a magnetic field in an effective horizontal direction in the first free layer. The moving element may include a second spin-orbit torque layer configured to induce a second spin orbit torque by the second current, the second spin-orbit torque layer corresponding to the first spin-orbit torque layer, a second free layer on the second spin-orbit torque layer, the moving element being configured to inject the magnetic domain into the second free layer based on the second spin orbit torque, and a second oxide layer on the second free layer.

In some embodiments, the magnetic hard mask may be on the insulating layer.

In some embodiments, the magnetic hard mask may overlap the first free layer and may not overlap the second free layer in a vertical direction, and the vertical direction may intersect the first horizontal direction and the second horizontal direction.

In some embodiments, the magnetic hard mask may include a first magnetic hard mask and a second magnetic hard mask that are apart from each other in the first horizontal direction.

In some embodiments, the magnetic hard mask may overlap the first free layer and may not overlap the second free layer in a vertical direction intersecting the first horizontal direction and the second horizontal direction.

In some embodiments, the writing element may include a first ferromagnet layer having horizontal magnetic anisotropy, a first spin-orbit torque layer on the first ferromagnet layer and configured to induce a first spin orbit torque based on the first current, and a first free layer on the first spin-orbit torque layer and configured to create the magnetic domain based on the first spin orbit torque. The moving element may include a second ferromagnet layer on a same plane as the first ferromagnet layer, a second spin-orbit torque layer on the second ferromagnet layer and configured to induce a second spin orbit torque, and a second free layer on the second spin-orbit torque layer, the moving element being configured to inject the magnetic domain into the second free layer based on the second spin orbit torque.

In some embodiments, the writing element may include a first antiferromagnetic layer configured to create a first spin current with an exchange bias field based on the first current, and a first free layer on the first antiferromagnetic layer and configured to create the magnetic domain with the exchange bias field based on the first spin current. The moving element may include a second antiferromagnetic layer on a same plane as the first antiferromagnetic layer and configured to create a second spin current based on the second current, and a second free layer on the second antiferromagnetic layer, the moving element being configured to inject the magnetic domain into the second free layer based on the second spin current.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
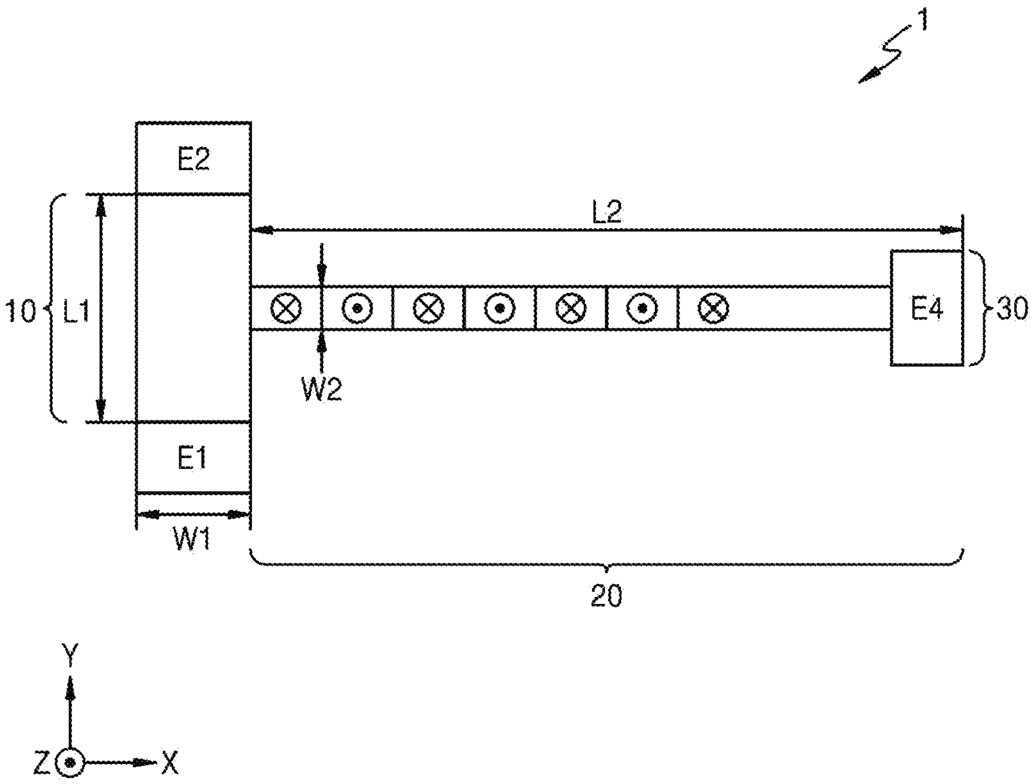
FIG. 1 is a schematic plan view of a racetrack memory device according to an embodiment.

Reference will now be made in detail to embodiments, examples of which are illustrated in the accompanying drawings, wherein like reference numerals refer to like elements throughout and sizes of components in the drawings may be exaggerated for convenience of explanation and clarity. In this regard, the embodiments may have different forms and should not be construed as being limited to the descriptions set forth herein. Accordingly, the embodiments are merely described below, by referring to the figures, to explain aspects. As embodiments described below are examples, other modifications may be produced from the embodiments.

Expressions such as “at least one of,” when preceding a list of elements, modify the entire list of elements and do not modify the individual elements of the list. For example, “at least one of A, B, and C,” and similar language (e.g., “at least one selected from the group consisting of A, B, and C”) may be construed as A only, B only, C only, or any combination of two or more of A, B, and C, such as, for instance, ABC, AB, BC, and AC.

When the terms “about” or “substantially” are used in this specification in connection with a numerical value, it is intended that the associated numerical value includes a manufacturing or operational tolerance (e.g., ±10%) around the stated numerical value. Moreover, when the words “generally” and “substantially” are used in connection with geometric shapes, it is intended that precision of the geometric shape is not required but that latitude for the shape is within the scope of the disclosure. Further, regardless of whether numerical values or shapes are modified as “about” or “substantially,” it will be understood that these values and shapes should be construed as including a manufacturing or operational tolerance (e.g., ±10%) around the stated numerical values or shapes. When ranges are specified, the range includes all values therebetween such as increments of 0.1%. While the term “equal to” is used in the description of example embodiments, it should be understood that some imprecisions may exist. Thus, when one element is referred to as “equal to” another element, it should be understood that an element or a value may be “equal to” another element within a desired manufacturing or operational tolerance range (e.g., ±10%).

When a constituent element is disposed “above” or “on” to another constituent element, the constituent element may include not only an element directly contacting on the upper/lower/left/right sides of the other constituent element, but also an element disposed above/under/left/right the other constituent element in a non-contact manner. As used herein, the singular forms “a,” “an,” and “the” are intended to include the plural forms as well, unless the context clearly indicates otherwise. Furthermore, the terms “comprises” and/or “comprising” used herein specify the presence of stated features or components, but do not preclude the presence or addition of one or more other features or components.

Also, the operations of all methods described herein can be performed in any suitable order unless otherwise indicated herein or otherwise clearly contradicted by context. The disclosure is not limited to the described order of the steps.

Furthermore, terms such as “ . . . portion,” “ . . . unit,” “ . . . module,” and “ . . . block” stated in the specification may signify a unit to process at least one function or operation and the unit may be embodied by hardware, software, or a combination of hardware and software.

Furthermore, the connecting lines, or connectors shown in the various figures presented are intended to represent functional relationships and/or physical or logical couplings between the various elements.

It will be understood that although the terms “first,” “second,” etc. may be used herein to describe various components, these components should not be limited by these terms. These terms are only used to distinguish one component from another.

The use of any and all examples, or language (e.g., “such as”) provided herein, is intended merely to better illuminate the disclosure and does not pose a limitation on the scope of the disclosure unless otherwise claimed.

Figure 2:
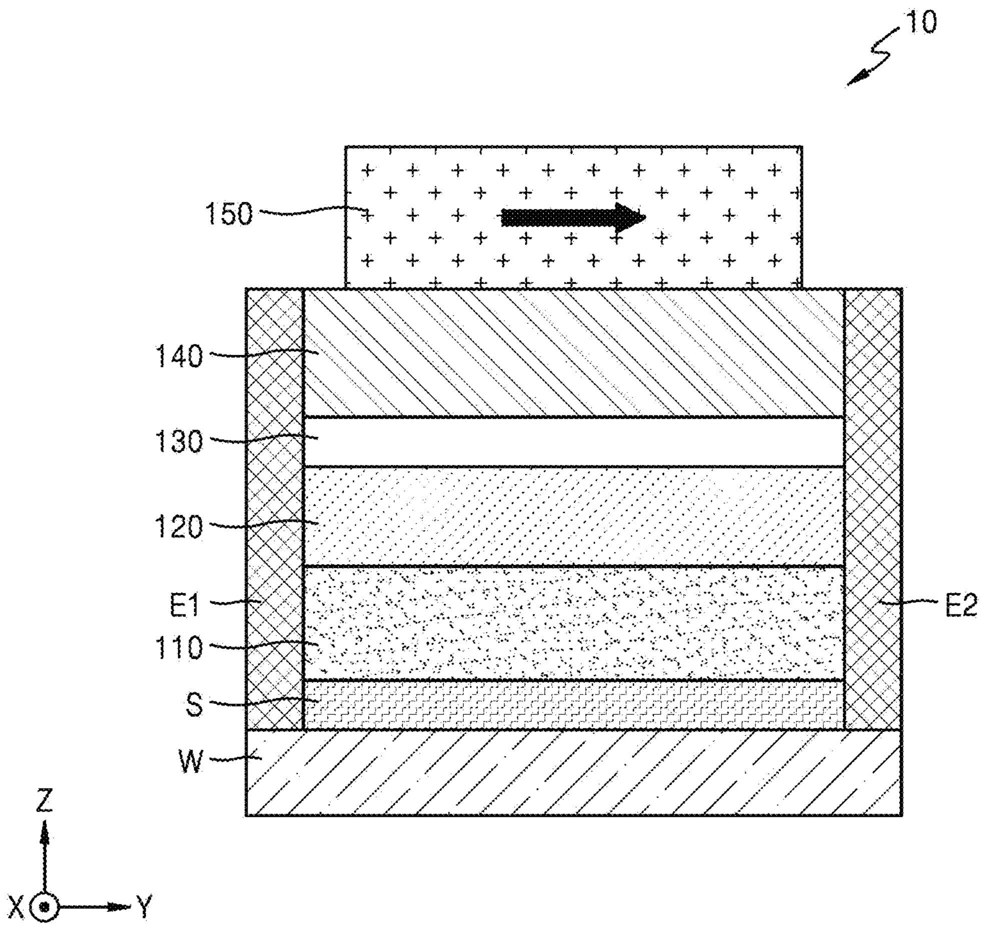
FIG. 2 is a cross-sectional view of a writing element of the racetrack memory device of FIG. 1.
Figure 3:
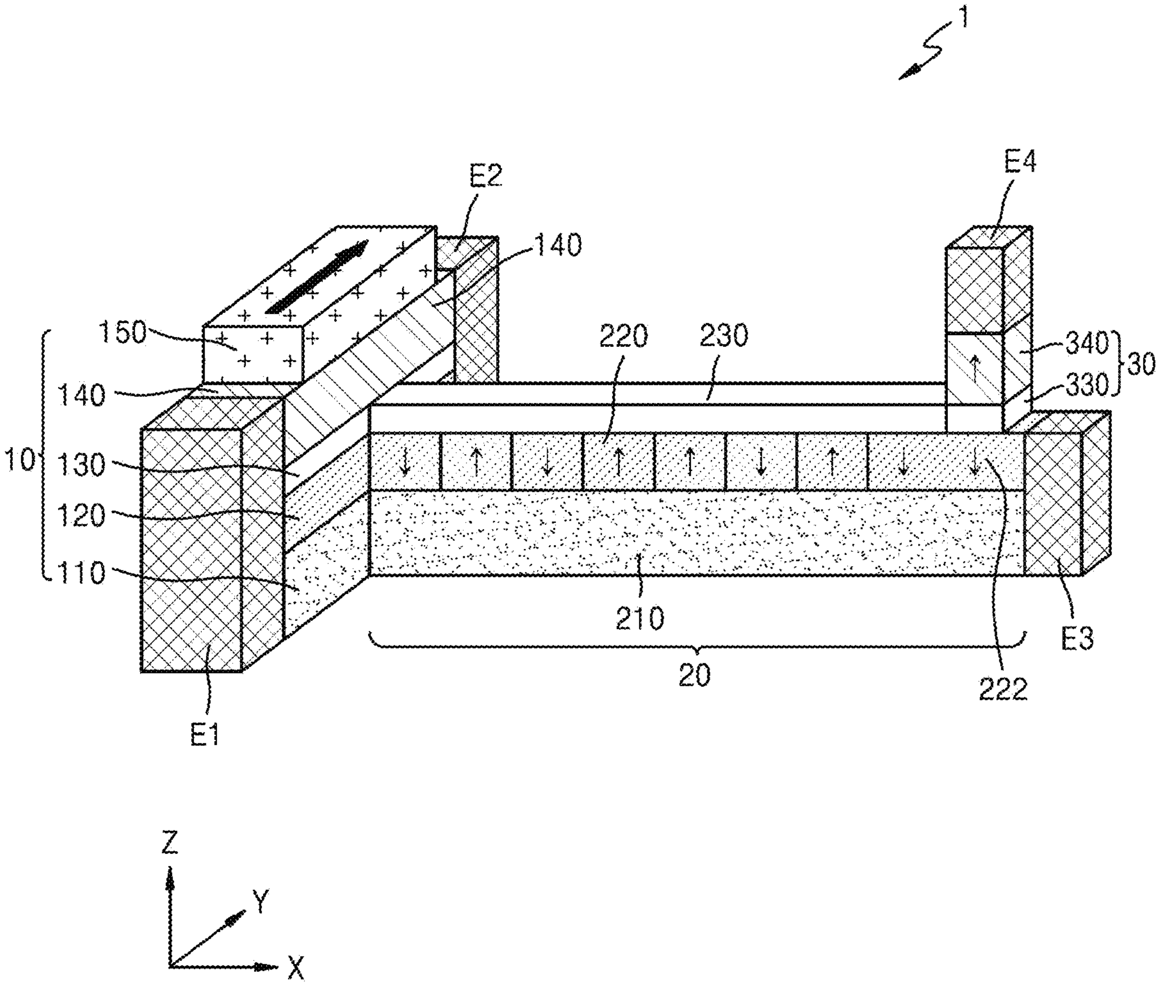
FIG. 3 is a schematic perspective view of the racetrack memory device of FIG. 1.

FIG. 1 is a plan view schematically showing a racetrack memory device 1 according to an embodiment, FIG. 2 is a cross-sectional view of a writing element 10 of the racetrack memory device 1 of FIG. 1, and FIG. 3 is a schematic perspective view of the racetrack memory device 1 of FIG. 1.

Referring to FIGS. 1 to 3, the racetrack memory device 1 may include the writing element 10 that creates a magnetic domain based on a first current applied thereto, a moving element 20 into which the magnetic domain created in the writing element 10 is injected based on a second current applied thereto or in which the injected magnetic domain is moved, and a reading element 30 that reads the magnetic domain included in the moving element 20.

The racetrack memory device 1 may include a first electrode E1 and a second electrode E2 that are respectively arranged at opposite ends of the writing element 10, a third electrode E3 that is arranged at one end of the moving element 20, and a fourth electrode E4 that is arranged at one end of the reading element 30. The writing element 10 and the moving element 20 may be disposed on the same substrate W, and the racetrack memory device 1 may further include a seed layer S.

The magnetic domain may be an area in which a magnetization direction is uniform, and a magnetic domain wall may be an area in which the magnetization direction is changed between the magnetic domains in the moving element 20. Each magnetic domain wall may define a boundary between magnetic domains having magnetization directions different from each other among the magnetic domains.

The writing element 10 may extend in a first horizontal direction (e.g., a Y direction), and create a magnetic domain based on a first current applied thereto. The writing element 10 may create a magnetic domain through magnetization switching based on the first current. For example, the first current may be applied to the writing element 10 through the first electrode E1 and the second electrode E2. The writing element 10 may create, based on the direction of the first current, a first magnetic domain having a magnetization direction in a vertical direction (e.g., a +Z direction) or a second magnetic domain having a magnetization direction in a direction (e.g., a −Z direction) opposite to the vertical direction. The first magnetic domain and the second magnetic domain may be referred to as an up domain and a down domain, respectively.

The first current may be applied to the writing element 10 whenever a magnetic domain having a magnetization direction opposite to the magnetization direction of the magnetic domain that is already created in the writing element 10 is created. For example, when a magnetic domain with the same magnetization direction as the magnetization direction of the magnetic domain that is already created in the writing element 10 is to be created, the first current may not be applied to the writing element 10. As the first current is applied to the writing element 10 only when a magnetic domain is created through magnetization switching, power supplied to the writing element 10 may be saved.

One end of the moving element 20 may be connected to the writing element 10 and may extend in a second horizontal direction (e.g., an X direction) crossing the first horizontal direction (e.g., the Y direction). The magnetic domain created in the writing element 10 may be injected into the moving element 20 based on the second current applied to the moving element 20, or in the moving element 20, the injected magnetic domain may be moved in the second horizontal direction (e.g., the X direction).

The moving element 20 may include a plurality of magnetic domains and a plurality of magnetic domain walls. The plurality of magnetic domains and the plurality of magnetic domain walls may be arranged alternately or repeatedly in the second horizontal direction (e.g., the X direction). The size and magnetization direction of each magnetic domain may be appropriately controlled by the shape, size, and second current of the moving element 20. The magnetic domains and/or the magnetic domain walls may be moved based on the second current applied to the moving element 20.

The second current may be applied to the moving element 20 through the first to third electrodes E1, E2, and E3. For example, the first and second electrodes E1 and E2 may be grounded, and the second current may be applied to the moving element 20 through the third electrode E3. The second current may be in a pulse form. The moving element 20 may inject the magnetic domain created in the writing element 10 into the moving element 20 or move the magnetic domain included in the moving element 20, based on the second current. The size of a magnetic domain may be proportional to the pulse width of the second current.

The reading element 30 may read the magnetic domain included in the moving element 20. For example, the first to third electrodes E1, E2, and E3 are grounded, and a third current may be applied to the reading element 30 through the fourth electrode E4. The reading element 30 may read a magnetic domain included in an area overlapping the reading element 30, among the moving element 20, based on the third current.

In the racetrack memory device 1 according to an embodiment, the writing element 10 and the moving element 20 may be spatially separated from each other. Then, the magnetic domain may be easily stored in the moving element 20 by multi-bit.

A width W2 of the moving element 20 may be less than a width W1 of the writing element 10. As the cross-sectional size of the moving element 20 in contact with the writing element 10 increases, edge pinning potential may increase accordingly. This is to limit and/or prevent occurrence of magnetization switching in the writing element 10. For example, a ratio of the width W1 of the writing element 10 to the width W2 of the moving element 20 may be about 1.5 or more, 2 or more, or 3 or more.

When the ratio of the width W1 of the writing element 10 to the width W2 of the moving element 20 is excessively large, the cross-section of the racetrack memory device 1 increases so that a lot of power may be consumed to operate the writing element 10, and thus, the ratio of the width W1 of the writing element 10 to the width W2 of the moving element 20 may be about 5 or less. Furthermore, a ratio of the length L1 of the writing element 10 to the width W2 of the moving element 20 may be about 2 or more (e.g., 2 to 10 or more). A ratio of a length L2 of the moving element 20 to the length L1 of the writing element 10 may be about 5 or more.

FIG. 2 is a cross-sectional view of the racetrack memory device 1 including the writing element 10 of FIG. 1. Referring to FIG. 2, the writing element 10 may include a first spin-orbit torque layer 110, a first free layer 120 disposed on the first spin-orbit torque layer 110, a first oxide layer 130 disposed on the first free layer 120, and an insulating layer 140 on the first oxide layer 130. The first and second electrodes E1 and E2 may be respectively arranged at the opposite ends of the writing element 10. The first current may be applied to the first spin-orbit torque layer 110 and the first free layer 120 through the first and second electrodes E1 and E2.

The first spin-orbit torque layer 110 may induce a spin orbit torque by the first current flowing therein. The first spin-orbit torque layer 110 may include non-magnetic heavy metal with an atomic number of 30 or higher. For example, the first spin-orbit torque layer 110 may include at least one of iridium (Ir), ruthenium (Ru), tantalum (Ta), platinum (Pt), palladium (Pd), bismuth (Bi), titanium (Ti), tungsten (W), and an alloy thereof, but the disclosure is not limited thereto.

The first free layer 120 may be disposed on the first spin-orbit torque layer 110. The first free layer 120 may include ferromagnet. For example, the first free layer 120 may include at least one of iron (Fe), cobalt (Co), nickel (Ni), manganese (Mn), a Fe-containing alloy, a Co-containing alloy, a Ni-containing alloy, a Mn-containing alloy, and a Heusler alloy. Alternatively, the first free layer 120 may have a synthetic antiferromagnetic (SAF) structure. For example, the first free layer 120 may include (Co/Ni) n/Ru/(Co/Ni) n or (Co/Ni) n/Ir/(Co/Ni) n that is a structure of a magnetic layer/a non-magnetic layer (Ru or Ir)/a magnetic layer.

The first oxide layer 130 may be disposed on the first free layer 120. The first oxide layer 130 may include a crystalline Mg oxide. For example, the first oxide layer 130 may include at least one of MgO, $Al_2O_3$, NaCl, and ZnO. The thickness of the first oxide layer 130 may be about 1 nm to about 3 nm.

The insulating layer 140 may be disposed on the first oxide layer 130. The insulating layer 140 may include an insulating material such as $SiO_2$.

A magnetic hard mask 150 may form a magnetic field in an effective horizontal direction (e.g., a −Y direction) on the first free layer 120. The magnetic hard mask 150 may be disposed on the insulating layer 140.

The magnetic hard mask 150 may include a material having in-plane magnetic anisotropy, for example, a ferromagnetic material including at least one of Fe, cobalt (Co), and Ni. The magnetic hard mask 150 may have a thickness greater than the thickness of the first free layer 120 to form a magnetic field having a sufficient size. For example, the thickness of the magnetic hard mask 150 may be about 5 times or more, about 10 times or more, or about 30 times or less of the thickness of the first free layer 120.

To form the magnetic field in the effective horizontal direction (e.g., the −Y direction) on the first free layer 120, the magnetic hard mask 150 may be sufficiently apart from the first free layer 120. For example, a distance between the magnetic hard mask 150 and the first free layer 120 may be about 10 nm or more, about 20 nm or more, or about 30 nm or more. However, when the distance between the magnetic hard mask 150 and the first free layer 120 is too large, the intensity of a magnetic field decreases, and thus, the distance between the magnetic hard mask 150 and the first free layer 120 may be about 100 nm or less or about 80 nm or less.

When the magnetic hard mask 150 is formed of Co to have a thickness of about 50 nm and the distance between the magnetic hard mask 150 and the first free layer 120 is about 30 nm, the magnetic hard mask 150 may generate an effective horizontal magnetic field of about 30 millitesla (mT) in the first free layer 120. The magnetic field in the effective horizontal direction (e.g., the −Y direction) having the above intensity is uniformly formed in the first free layer 120, and it may be sufficient to perform magnetization switching in the first free layer 120 without injection of an external magnetic field.

When the magnetic field in the effective horizontal direction (e.g., −Y direction) is formed in the first free layer 120 by the magnetic hard mask 150, the magnetization direction of the first free layer 120 aligned in a vertical direction (e.g., a Z direction) may be inclined in a horizontal direction (e.g., the −Y direction) by the magnetic field in the effective horizontal direction (e.g., the −Y direction) described above. In such an inclined state, when a current flows in the first spin-orbit torque layer 110, a first spin current polarized in a specific direction is generated in the first spin-orbit torque layer 110 so that a first spin orbit torque corresponding thereto may be induced. As the magnetization direction of the first free layer 120 is rotated by the first spin orbit torque described above, magnetization switching occurs so that a magnetic domain may be created. The creation of a magnetic domain described above corresponds to writing of a magnetic domain.

Referring to FIG. 3, the moving element 20 may include a second spin-orbit torque layer 210, a second free layer 220 disposed on the second spin-orbit torque layer 210, and a second oxide layer 230 disposed on the second free layer 220. One ends of the second spin-orbit torque layer 210, the second free layer 220, and the second oxide layer 230 may be in contact with the first spin-orbit torque layer 110, the first free layer 120, and the first oxide layer 130, respectively. The second spin-orbit torque layer 210, the second free layer 220, and the second oxide layer 230 may be integrally formed with the first spin-orbit torque layer 110, the first free layer 120, and the first oxide layer 130, respectively. As the second spin-orbit torque layer 210, the second free layer 220, and the second oxide layer 230 correspond to the first spin-orbit torque layer 110, the first free layer 120, and the first oxide layer 130 of the writing element 10, respectively, a detailed description thereof is omitted. The moving element 20 does not include the magnetic hard mask 150 included in the writing element 10. The racetrack memory device 1 may further include the third electrode E3 arranged in the other end of the moving element 20.

A second voltage may be applied to the writing element 10 and the moving element 20 through the first to third electrodes E1, E2, and E3. For example, the first and second electrodes E1 and E2 may be grounded, and the second voltage may be applied to the third electrode E3. The second current may flow in the first and second spin-orbit torque layers 110 and 210. The second voltage and the second current both may be of a pulse type. A spin current polarized in a specific direction may be generated in the first and second spin-orbit torque layers 110 and 210, and a second spin orbit torque corresponding to the spin current described above may be induced.

A torque in the second horizontal direction (e.g., the X direction) among the second spin orbit torque may move the magnetic domain included in the writing element 10 in the second horizontal direction (e.g., the X direction) to be injected into the moving element 20. Furthermore, the torque in the second horizontal direction (e.g., the X direction) of the second spin orbit torque may move the magnetic domain included in the moving element 20 in the second horizontal direction (e.g., the X direction).

The movement range of a magnetic domain or the size of a magnetic domain may vary depending on the pulse width of the second current. For example, as the pulse width of the second current decreases, the movement range of a magnetic domain or the size of a magnetic domain may decrease. Accordingly, by applying the second current with a small pulse width to the writing element 10 and the moving element 20, a lot of magnetic domain may be stored in the moving element 20. For synchronization of the first current and the second current, the pulse width of the first current may be the same as the pulse width of the second current.

The reading element 30 may include a third oxide layer 330 disposed on the moving element 20 and a fixed layer 340 disposed on the third oxide layer 330. In the racetrack memory device 1, the moving element 20 and the reading element 30 may configure a magnetic tunnel junction (MTJ) structure.

The third oxide layer 330 may correspond to the first and second oxide layers 130 and 230. For example, the first to third oxide layers 130, 230, and 330 may be formed integrally. The third oxide layer 330 included in the reading element 30 may be referred to as a tunnel barrier layer. Electrons included in an area of the moving element 20 overlapping the reading element 30 in the thickness direction of the moving element 20 may enter the fixed layer 340 through quantum tunneling of the third oxide layer 330.

The fixed layer 340 may include a ferromagnetic material. The fixed layer 340 may further include an antiferromagnetic material for fixing the magnetization direction. For example, the fixed layer 340 may include at least one metal material of Co, Fe, and Ni. Furthermore, the fixed layer 340 may further include at least one of non-magnetic materials, such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N).

Although the fixed layer 340 is illustrated as having a single layer structure, this is an example, and the disclosure is not limited thereto. In some embodiments, the fixed layer 340 may be provided in a synthetics antiferromagnetic structure (SAF).

The magnetization direction of the fixed layer 340 is fixed, and the magnetization direction of the moving element 20 may be a parallel or anti-parallel direction with the magnetization direction of the fixed layer 340 according to stored data.

The fixed layer 340 may overlap a portion (referred to as the magnetic conversion portion 222) of the moving element 20 in the vertical direction (e.g., the Z direction). Accordingly, in the racetrack memory device 1, the magnetic tunnel junction structure may read out data corresponding to the magnetization direction of the magnetic conversion portion 222.

When the moving element 20 and the fixed layer 340 of the magnetic tunnel junction structure are in a parallel state, in other words, the magnetic tunnel junction structure shows low resistance, and such a state may be defined as a data 0 (zero) state. Reversely, when the moving element 20 and the fixed layer 340 of the magnetic tunnel junction structure are in an anti-parallel state, in other words, the magnetic tunnel junction structure shows high resistance, and such a state may be defined as a data 1 (one) state. In some embodiments, the magnetic tunnel junction structure in the anti-parallel state may be defined in a data 0 state, and the magnetic tunnel junction structure in the parallel state may be defined in a data 1 state.

Figure 4A:
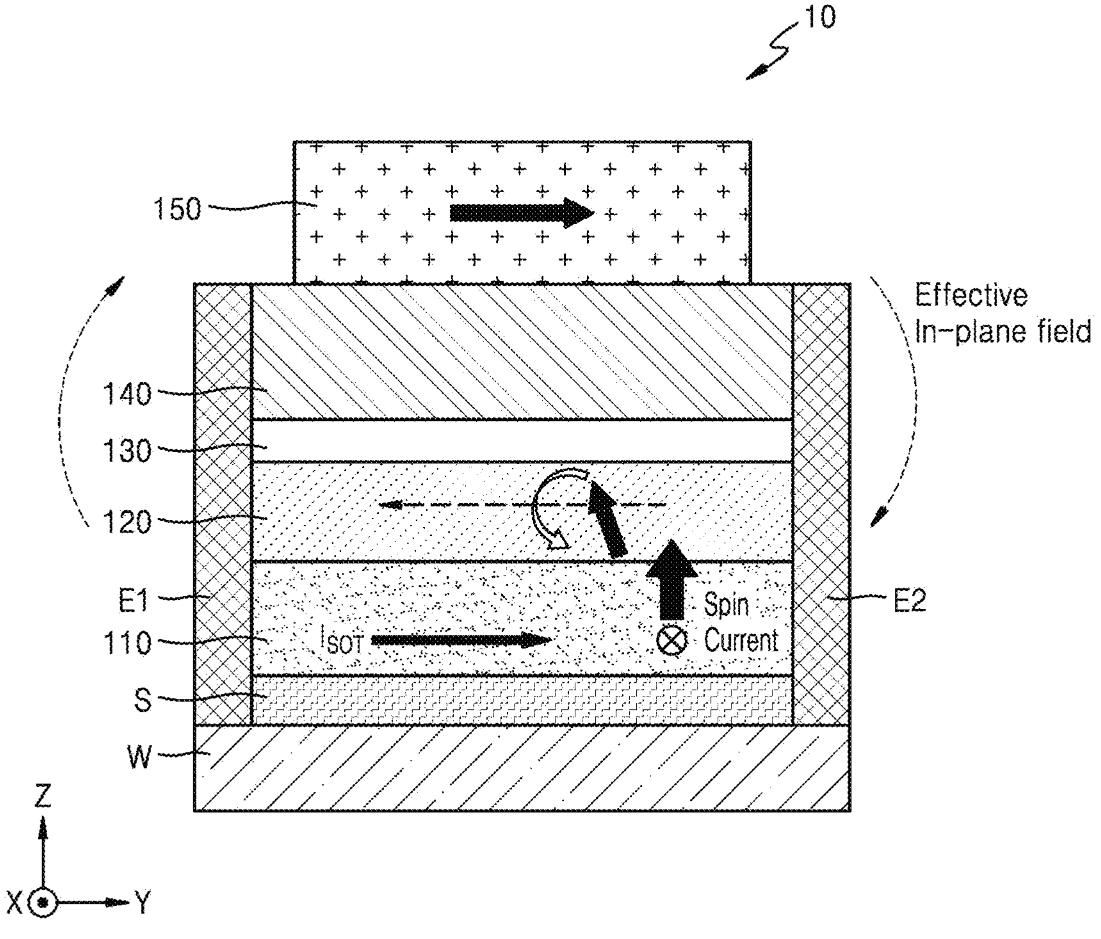
FIG. 4A is a reference diagram for describing a method of creating a magnetic domain according to a current direction in a writing element, according to an embodiment.
Figure 4B:
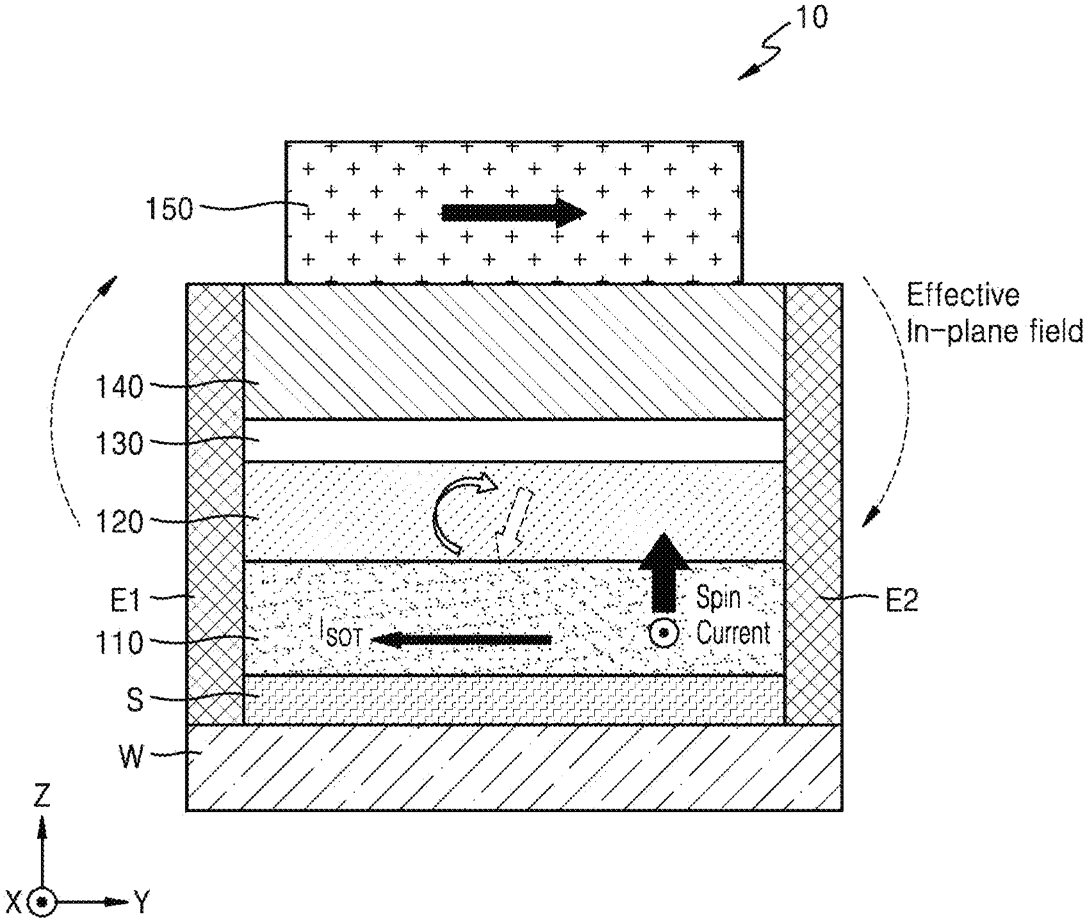
FIG. 4B is a reference diagram for describing a method of creating a magnetic domain according to a current direction in the writing element, according to an embodiment.

FIGS. 4A and 4B are reference diagrams for describing a method of creating a magnetic domain according to a current direction in the writing element 10, according to an embodiment.

Referring to FIG. 4A, a first voltage may be applied between the first electrode E1 and the second electrode E2 so that a first current flows in the writing element 10 in a first horizontal direction ($I_{SOT}$, for example, a +Y direction). Then, in the first spin-orbit torque layer 110, a spin current polarized in a specific direction is generated by the first current so that first spin orbit torque corresponding thereto may be induced. For example, in the first spin-orbit torque layer 110, a spin current polarized in a −X direction is generated so that the first spin orbit torque corresponding thereto may be induced. Through an interaction between the magnetic field in an effective horizontal direction (EE, e.g., a −Y direction) generated by the magnetic hard mask 150 and the induced spin orbit torque, the magnetization direction of the first free layer 120 may be rotated, and thus, magnetization switching may be made. Then, the first free layer 120 may create a magnetic domain having a magnetization direction in a −Z direction.

Referring to FIG. 4B, a voltage may be applied between the first electrode E1 and the second electrode E2 to flow a first current in the writing element 10 in a second horizontal direction, that is, the opposite direction ($I_{SOT}$, for example, the −Y direction) of the first horizontal direction. Then, in the first spin-orbit torque layer 110, a spin current polarized in a direction perpendicular to the opposite direction (EE, e.g., the −Y direction) of the first horizontal direction, for example, in the +X direction, is generated by the first current so that a first spin orbit torque corresponding thereto may be induced. Through an interaction between the magnetic field in the effective horizontal direction (e.g., the −Y direction) generated by the magnetic hard mask 150 and the first spin orbit torque, the magnetization direction of the first free layer 120 may be rotated, and thus, magnetization switching may be made. Then, the first free layer 120 may create a magnetic domain having a magnetization direction in a +Z direction.

Figure 5A:
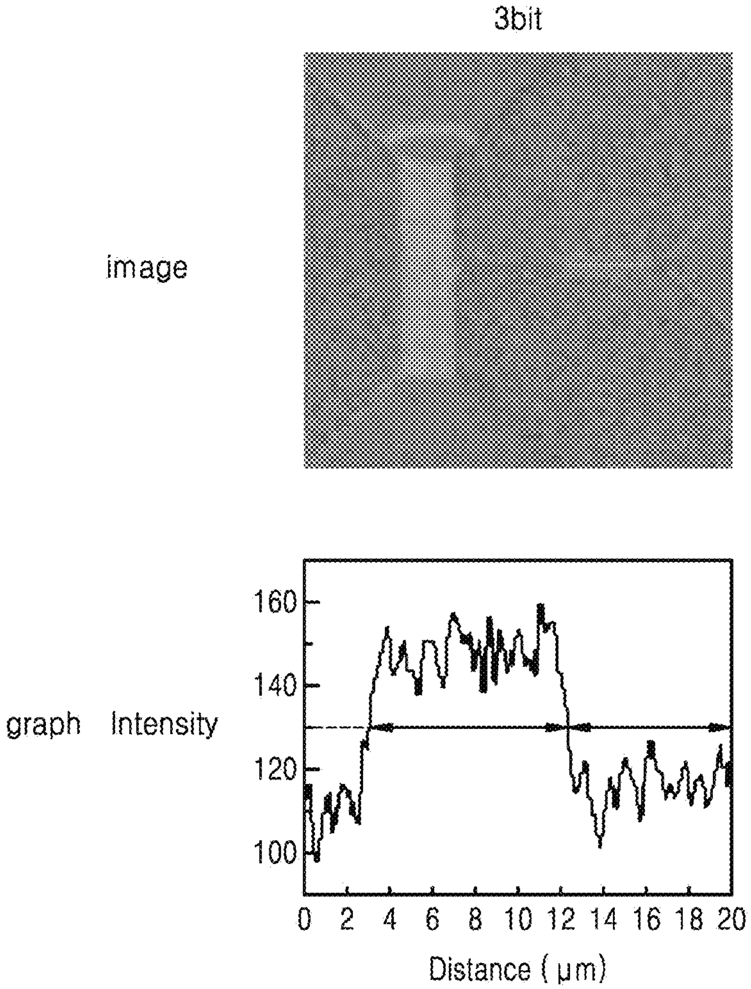
FIGS. 5A to 5D show results of measurements of a size of a magnetic domain according to a pulse width of a second current, according to an embodiment.
Figure 5B:
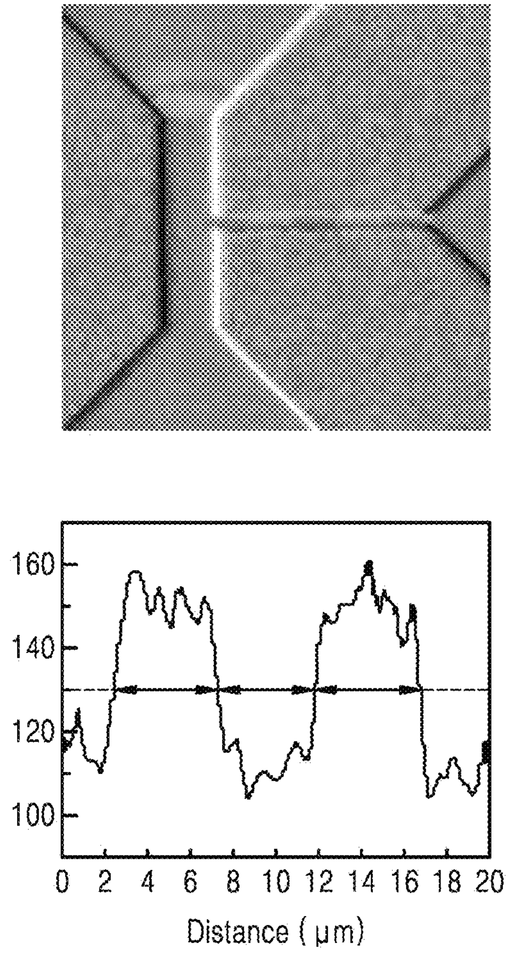
Figure 5C:
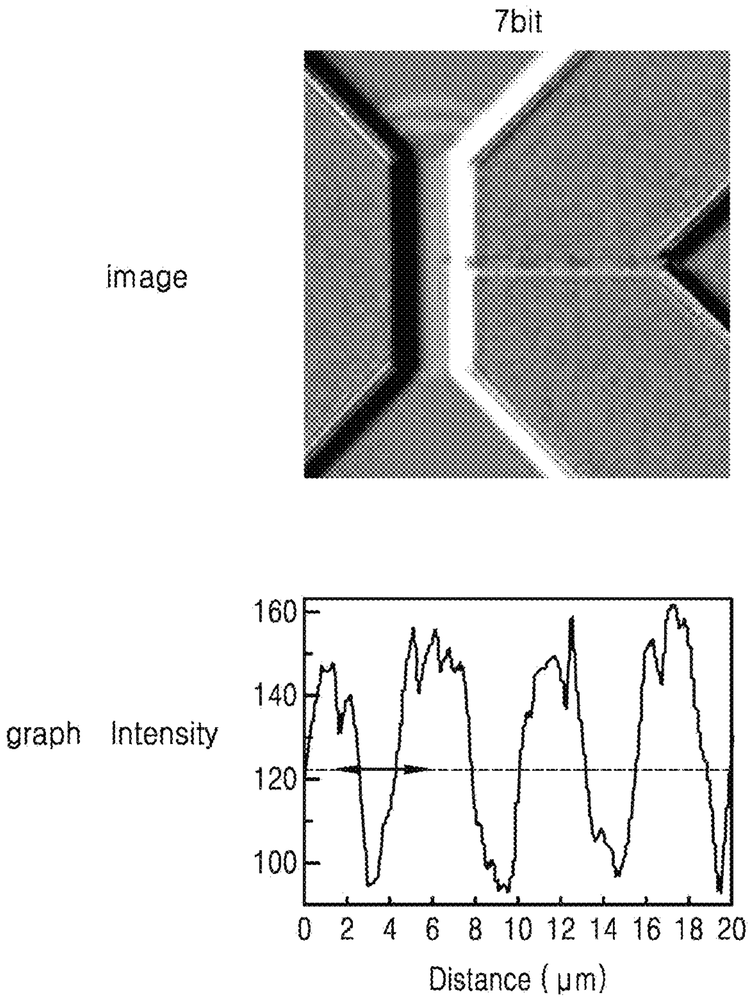
Figure 5D:
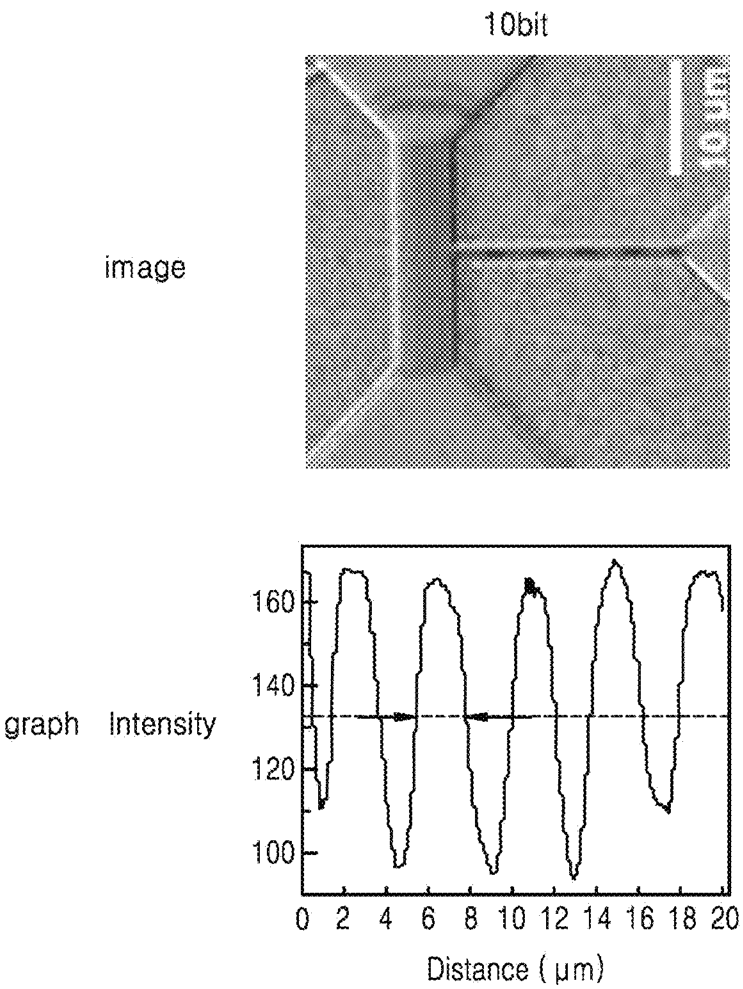

FIGS. 5A to 5D show results of measurements of the size of a magnetic domain according to a pulse width of a second current, according to an embodiment. FIG. 5A shows a result of applying a second current having a pulse width of 30 nm to the moving element 20. FIG. 5B shows a result of applying a second current having a pulse width of 10 nm to the moving element 20. FIG. 5C shows a result of applying a second current having a pulse width of 3 nm to the moving element 20. FIG. 5D shows a result of applying a second current having a pulse width of 1 nm to the moving element 20. Each of FIGS. 5A to 5D includes an image over a graph. Each image included in FIGS. 5A to 5D is a magneto-optical Kerr effect (MOKE) microscopic image by photographing the racetrack memory device 1, and each graph shows a graphic result of luminance intensity by distance to the image. The luminance intensity is related to the magnetization direction of a magnetic domain. In the graphs of FIGS. 5A to 5D, a region in which the luminance intensity has a value greater than a reference value may represent a magnetic domain having a magnetization direction in the +Z direction, and a region in which the luminance intensity has a value less than the reference value may represent a magnetic domain having a magnetization direction in the −Z direction opposite to the +Z direction.

Referring to FIGS. 5A to 5D, it may be checked that when a second current having a pulse width of 30 nm is applied to the moving element 20, three magnetic domains, that is, 3 bits data, are stored in the moving element 20. When a second current having a pulse width of 10 nm is applied to the moving element 20, five magnetic domains, that is, 5 bits data, are stored in the moving element 20. Furthermore, it may be checked that when a second current having a pulse width of 3 nm is applied to the moving element 20, seven magnetic domains, that is, 7 bits data, are stored in the moving element 20. When a second current having a pulse width of 1 nm is applied to the moving element 20, ten magnetic domains, that is, 10 bits data, are stored in the moving element 20. In other words, it may be checked that as the pulse width of the second current decreases, more magnetic domains may be moved or stored in the moving element 20.

FIGS. 6A to 6E are reference diagrams for describing an operation of the racetrack memory device 1 according to an embodiment.

Figure 6A:
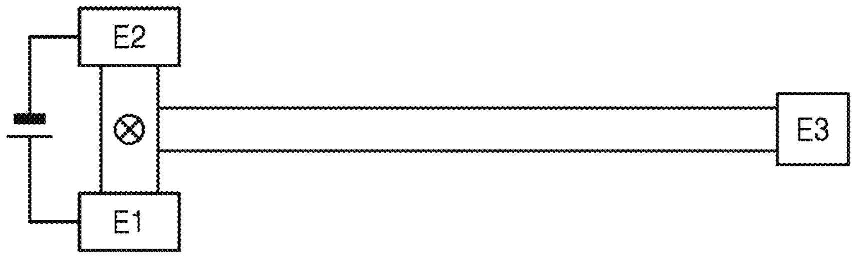
FIGS. 6A to 6E are reference diagrams for describing an operation of a racetrack memory device according to an embodiment.

In FIG. 6A, in the writing element 10, a first voltage may be applied between the first electrode E1 and the second electrode E2 to allow a first current to flow in the first horizontal direction (e.g., the +Y direction). Then, in the first spin-orbit torque layer 110, a spin current polarized in the −X direction is generated corresponding to the first current so that a first spin orbit torque corresponding thereto may be induced. Through an interaction between the magnetic field in the effective horizontal direction (e.g., the −Y direction) generated by the magnetic hard mask 150 and the first spin orbit torque, a magnetic domain having a magnetization direction in the −Z direction may be created in the first free layer 120.

Figure 6B:
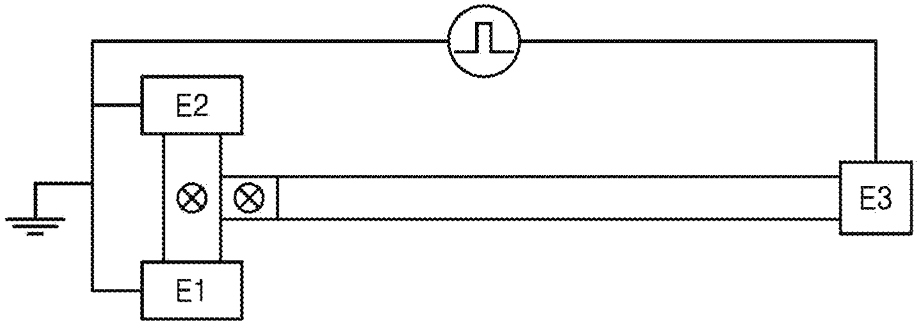

Referring to FIG. 6B, the second current of a pulse type may be applied to the writing element 10 and the moving element 20 through the first to third electrodes E1, E2, and E3. For example, the first and second electrodes E1 and E2 may be grounded, and the second voltage of a pulse type may be applied through the third electrode E3. The sign of the second voltage may be negative. A spin current polarized in the first horizontal direction (e.g., the +Y direction) is generated by the second current in the second spin-orbit torque layer 210 so that a second spin orbit torque corresponding to the spin current may be induced. The spin orbit torque described above may include a torque in the vertical direction (e.g., the Z direction) and a torque in the second horizontal direction (e.g., the +X direction) in the first free layer 120. While the torque in the vertical direction (e.g., the Z direction) does not affect the movement of the magnetic domain, the torque in the second horizontal direction (e.g., the +X direction) may move the magnetic domain included in the first free layer 120 in the second horizontal direction (e.g., the +X direction) so that the magnetic domain may be injected into the second free layer 220, that is, the moving element 20.

The intensity of the second voltage (or the absolute value of the second voltage) for moving or storing a magnetic domain may be less than or equal to the intensity of the first voltage (or the absolute value of the first voltage). As the second voltage is to move the magnetic domain in the second horizontal direction, it does not matter that the second voltage is less than the first voltage for magnetization switching. For example, the intensity of the second voltage may be ½ or less than the intensity of the first voltage, or the intensity of the second voltage may be a Gilbert damping constant multiple or less of the intensity of the first voltage.

Figure 6C:
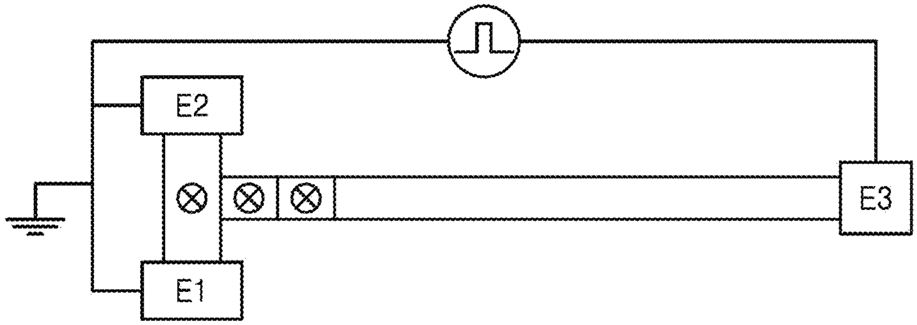

Referring to FIG. 6C, the second current of a pulse type may be continuously applied to the writing element 10 and the moving element 20 through the first to third electrodes E1, E2, and E3. For example, the first and second electrodes E1 and E2 may be grounded, and a second voltage of a pulse type may be applied through the third electrode E3. The magnetic domain included in the second spin-orbit torque layer 210 may be moved by the second current in the second horizontal direction (e.g., the +X direction), and the magnetic domain included in the first free layer 120 may be moved in the second horizontal direction (e.g., the +X direction) to be injected into the second free layer 220, that is, the moving element 20. As the movement of a magnetic domain is described above in FIG. 6A, a detailed description thereof is omitted.

Figure 6D:
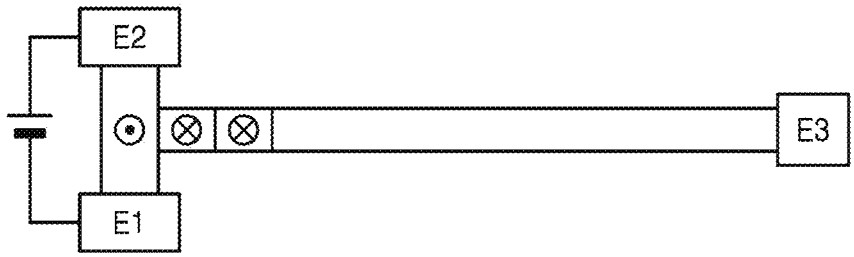

As illustrated in FIG. 6D, to allow the first current to flow in the writing element 10 in the direction (e.g., the −Y direction) opposite to the first horizontal direction, the first voltage may be applied between the first electrode E1 and the second electrode E2. Then, a spin current polarized in the +X direction is generated by the first current in the first spin-orbit torque layer 110 so that a first spin orbit torque corresponding thereto may be induced. Through an interaction between the magnetic field in the effective horizontal direction (e.g., the −Y direction) generated by the magnetic hard mask 150 and the first spin orbit torque, the magnetization direction of the first free layer 120 may be rotated counterclockwise, and thus, magnetization switching may be made. Then, the free layer 120 may create a magnetic domain having a magnetization direction in the +Z direction.

Figure 6E:
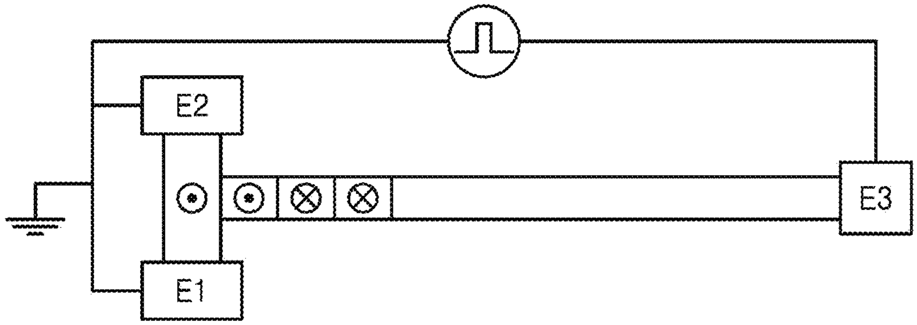

As illustrated in FIG. 6E, the second current of a pulse type may be applied to the writing element 10 and the moving element 20 through the first to third electrodes E1, E2, and E3. By the second current, the magnetic domain included in the second free layer 220 is moved in the second horizontal direction (e.g., the +X direction), and the magnetic domain included in the first free layer 120 is moved in the second horizontal direction (e.g., the +X direction) so as to be injected into the second free layer 220, that is, the moving element 20.

Although the magnetic domain is described above as being moved by the second voltage in the second horizontal direction (e.g., the +X direction), the disclosure is not limited thereto. When the direction of a current is opposite, the movement direction of the magnetic domain may be the opposite direction.

Figure 7A:
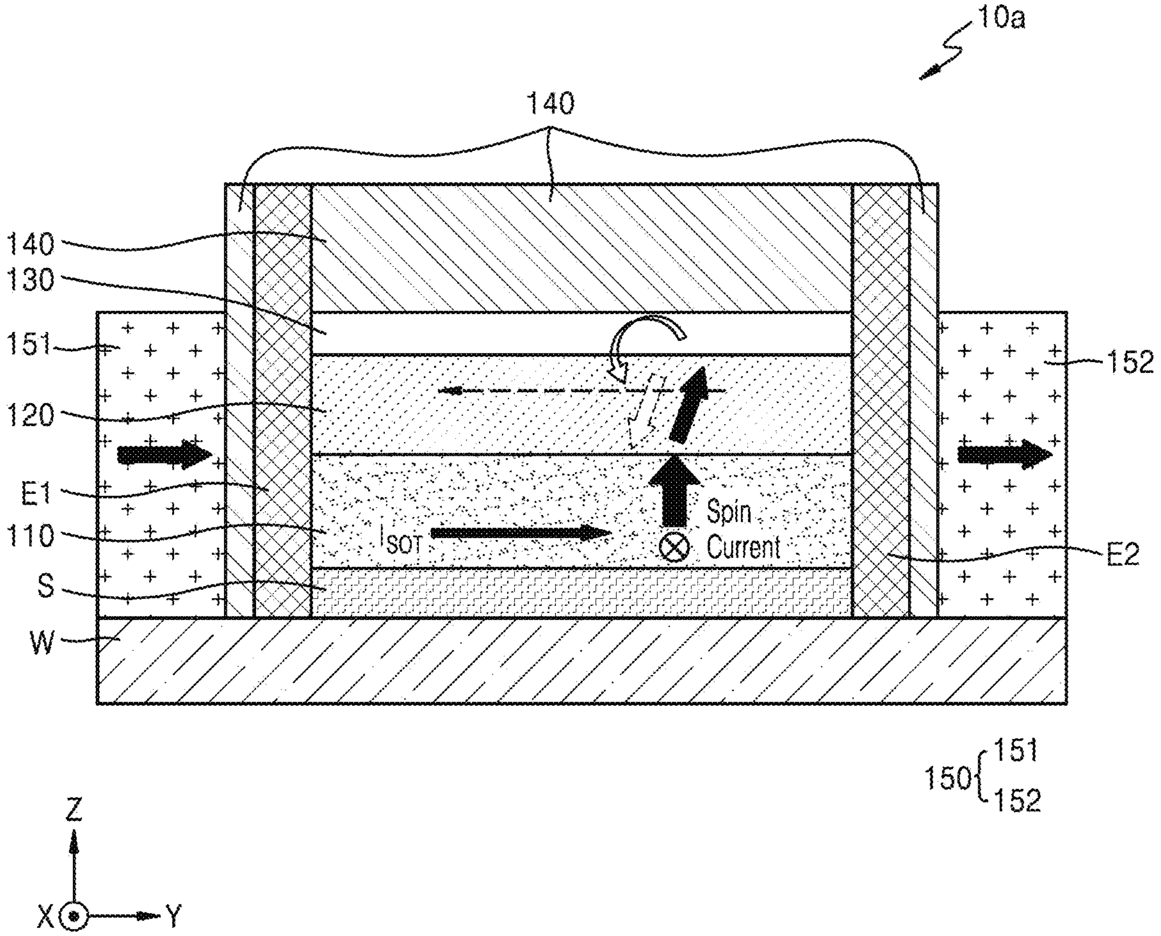
FIG. 7A is a cross-sectional view of a portion of a racetrack memory device including a plurality of magnetic hard masks, according to another embodiment.
Figure 7B:
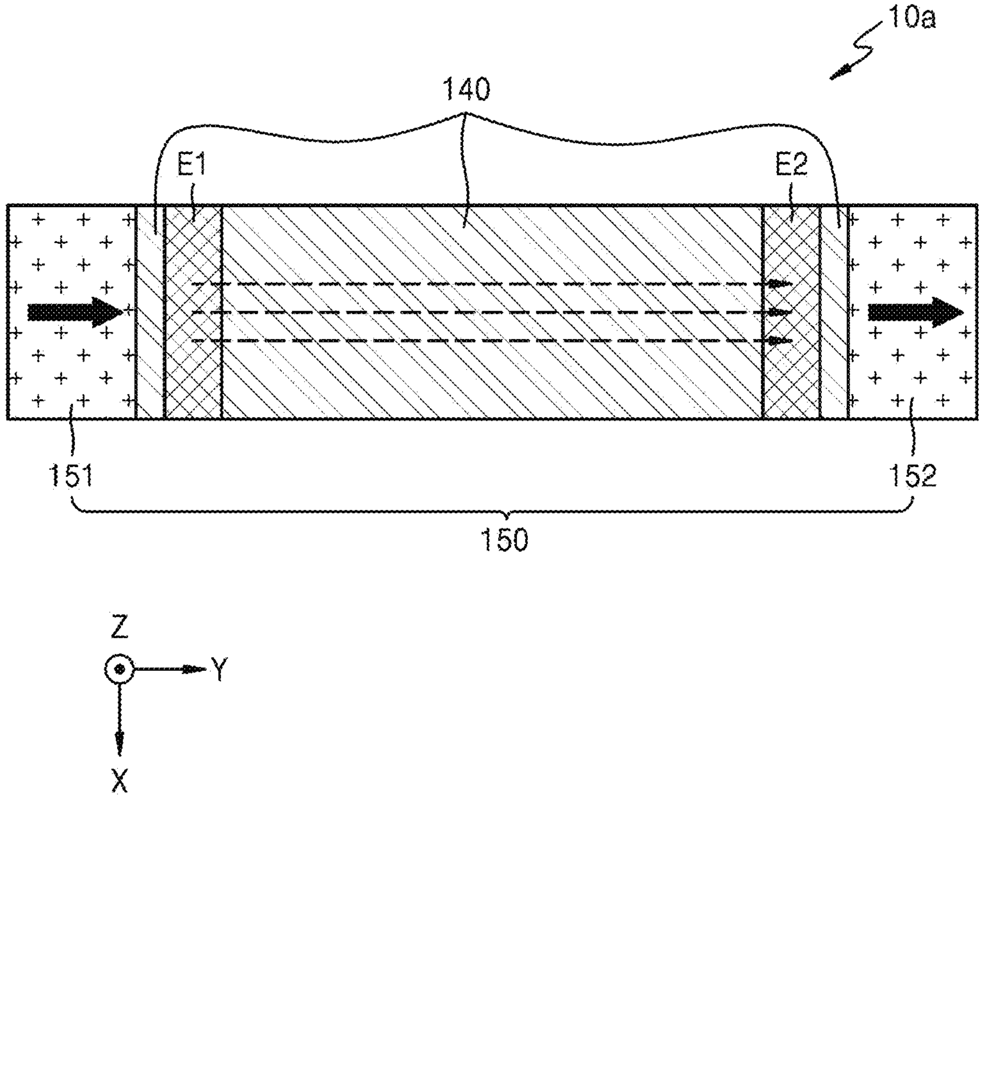
FIG. 7B is a plan view of a portion of the racetrack memory device of FIG. 7A.

FIG. 7A is a cross-sectional view of a portion of a racetrack memory device including a plurality of magnetic hard masks, according to another embodiment, and FIG. 7B is a plan view of a portion of the racetrack memory device of FIG. 7A.

Referring to FIGS. 7A and 7B, the magnetic hard mask 150 may include a first magnetic hard mask 151 and a second magnetic hard mask 152, which are apart from each other. The first magnetic hard mask 151 and the second magnetic hard mask 152 may be apart from each other in the first horizontal direction (e.g., the +Y direction). The first magnetic hard mask 151 and the second magnetic hard mask 152 may be located outside the first electrode E1 and the second electrode E2, respectively. The first magnetic hard mask 151 and the second magnetic hard mask 152 are symmetrically arranged with respect to the center axis of the writing element 10 and may generate a magnetic field in the effective horizontal direction (EE, e.g., the +Y direction) in the first free layer 120. As the moving element 20 and the reading element 30 of FIG. 3 are employed herein, detailed descriptions thereof are omitted.

Figure 8:
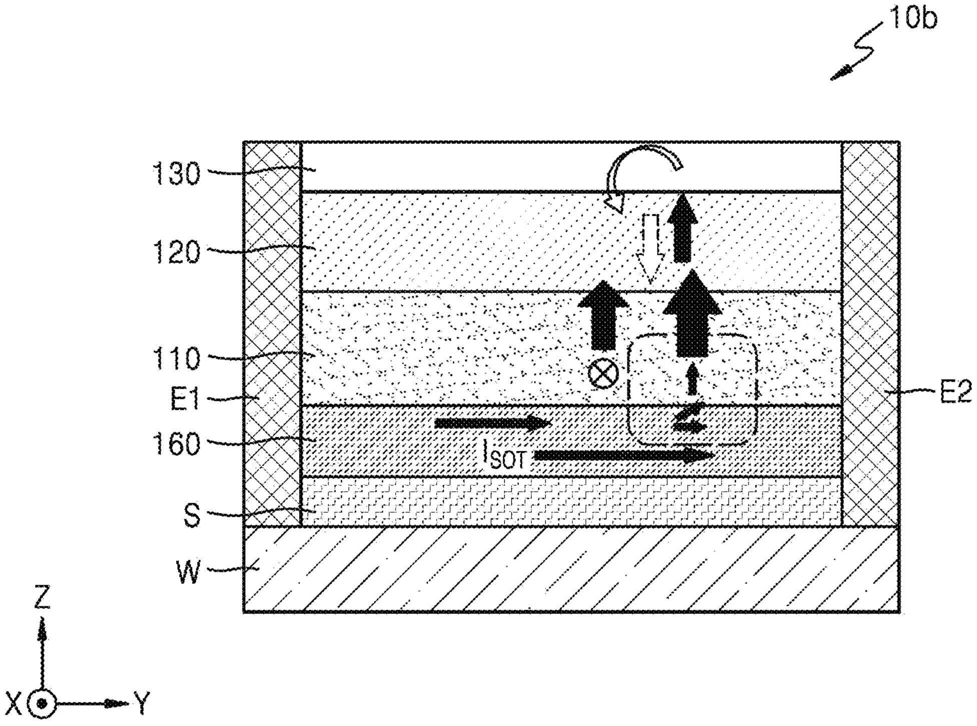
FIG. 8 is a cross-sectional view of a writing element according to another embodiment.
Figure 9:
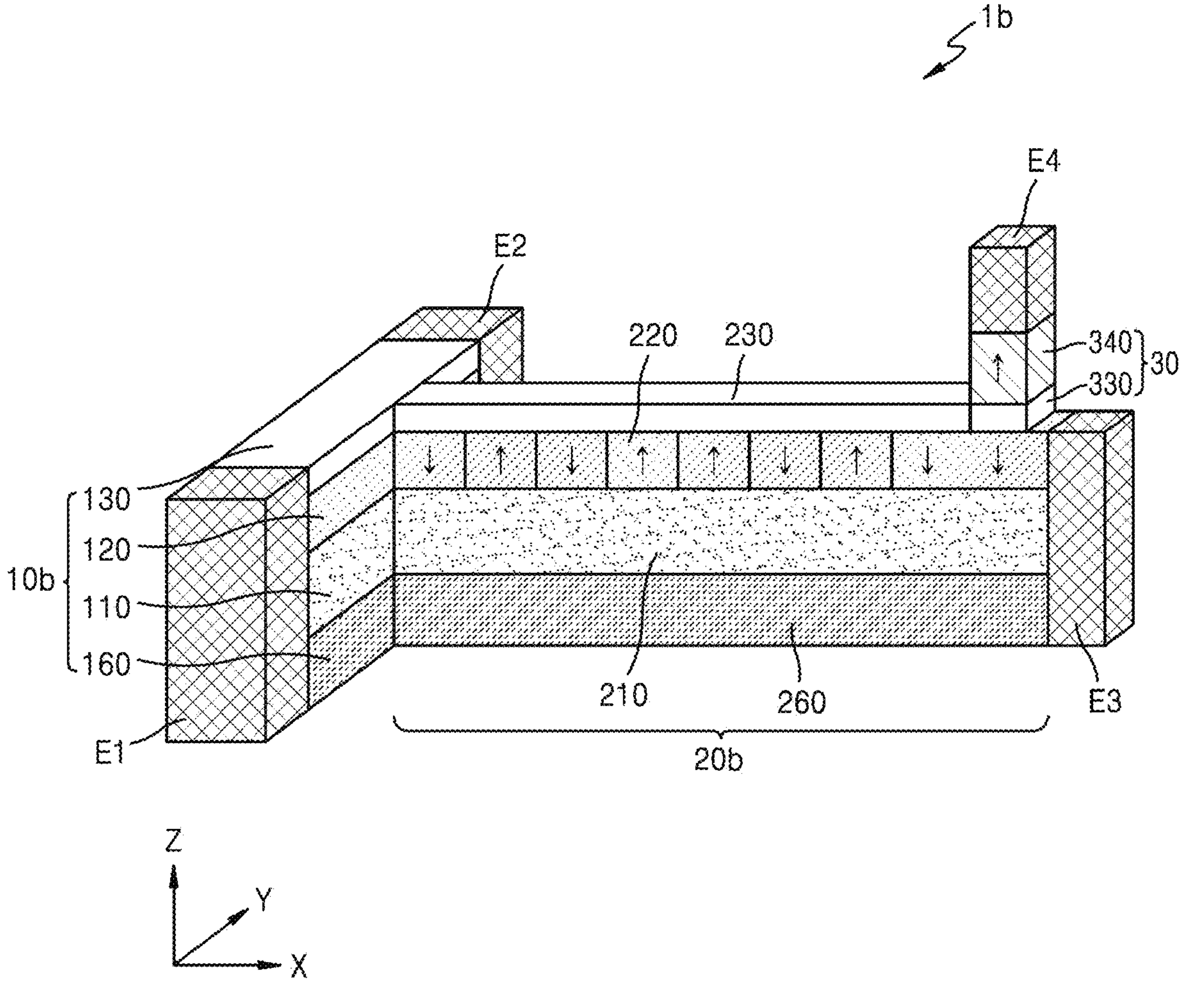
FIG. 9 is a perspective view of a racetrack memory device including the writing element of FIG. 8.

FIG. 8 is a cross-sectional view of a writing element 10*b* according to another embodiment. FIG. 9 is a perspective view of a racetrack memory device 1*b* including the writing element 10*b* of FIG. 8. Referring to FIGS. 8 and 9, the writing element 10*b* may include a first ferromagnet layer 160 that generates a spin current polarized in the vertical direction (e.g., the +Z direction), a first spin-orbit torque layer 110 disposed on the first ferromagnet layer 160, the first free layer 120 disposed on the first spin-orbit torque layer 110, and the first oxide layer 130 disposed on the first free layer 120. The first spin-orbit torque layer 110, the first free layer 120, and the first oxide layer 130 may correspond to the first spin-orbit torque layer 110, the first free layer 120, and the first oxide layer 130 described in FIG. 2.

The first ferromagnet layer 160 may include a ferromagnet having in-plane magnetic anisotropy. The ferromagnet may include at least one of Fe, Co, and Ni. The ferromagnet layer has a magnetization direction aligned in the first horizontal direction (e.g., the Y direction).

The first ferromagnet layer 160 may be disposed below the first spin-orbit torque layer 110 in contact therewith. When the first ferromagnet layer 160 is disposed in contact with the first spin-orbit torque layer 110, the thickness of the first ferromagnet layer 160 does not need to be as large as the magnetic hard mask 150 described In FIG. 2. The first ferromagnetic layer 160 may have any thickness capable of producing horizontal magnetic anisotropy characteristics. In contrast, the first free layer 120 has vertical magnetic anisotropic characteristics, and thus, the thickness of the first free layer 120 may be less than or equal to the thickness of the first ferromagnet layer 160.

When the first current is applied to the first ferromagnet layer 160, in the first ferromagnet layer 160, a spin current polarized in the first horizontal direction (e.g., the +Y direction or the −Y direction) is changed to the vertical direction (e.g., the +Z direction or the −Z direction) at an interface between the first ferromagnet layer 160 and the first spin-orbit torque layer 110. When the first current is also applied to the first spin-orbit torque layer 110, in the first spin-orbit torque layer 110, a spin current polarized in the second horizontal direction (e.g., the +X direction or the −X direction) so that a spin orbit torque corresponding thereto may be induced. The magnetization switching may be effectively performed in the first free layer 120 by the spin current polarized in the vertical direction (e.g., the +Z direction or the −Z direction) and the spin current polarized in the second horizontal direction (e.g., the +X direction or the −X direction). In other words, the spin current polarized in the vertical direction (e.g., the +Z direction or the −Z direction) may easily control the magnetization direction of the first free layer 120 even when the magnetization direction in the first free layer 120 maintains the symmetricity.

The moving element 20 may include a second ferromagnet layer 260, the second spin-orbit torque layer 210, the second free layer 220, and the second oxide layer 230. The second ferromagnet layer 260, the second spin-orbit torque layer 210, the second free layer 220, and the second oxide layer 230 may correspond to the first ferromagnet layer 160, the first spin-orbit torque layer 110, the first free layer 120, and the first oxide layer 130, respectively. The second ferromagnet layer 260, the second spin-orbit torque layer 210, the second free layer 220, and the second oxide layer 230 may be formed integrally with the first ferromagnet layer 160, the first spin-orbit torque layer 110, the first free layer 120, and the first oxide layer 130, respectively.

The intensity of the second voltage applied to the writing element 10 and the moving element 20 may be less than the intensity of the first voltage applied to the writing element 10. For example, the intensity of the second voltage may be 1/3 or less, 1/5 or less, or 1/10 or less of the intensity of the first voltage. As the intensity of the second voltage is less than the intensity of the first voltage, the spin currents by the first and second ferromagnet layers 130 and 260 do not affect the injection and movement of the magnetic domain. Accordingly, a spin current polarized in the first horizontal direction (e.g., the +Y direction or the −Y direction) generated in the second spin-orbit torque layer 210 may move the magnetic domain. The method in which the moving element 20 moves the magnetic domain is described above, and thus, a detailed description thereof is omitted.

Figure 10:
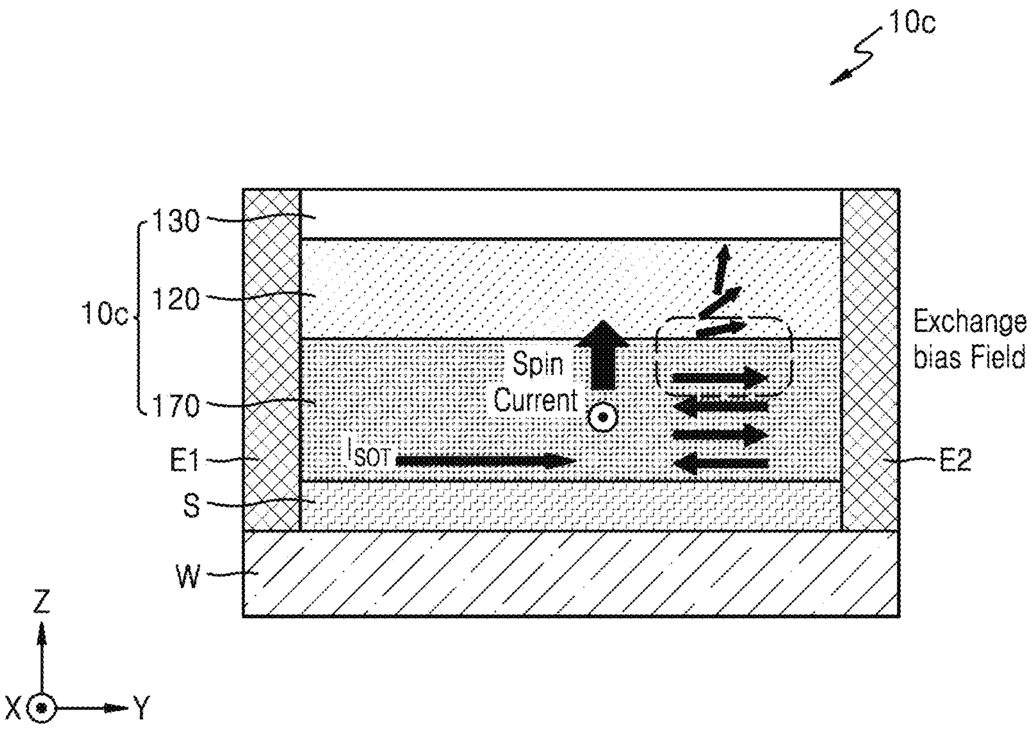
FIG. 10 is a cross-sectional view of a writing element according to another embodiment.
Figure 11:
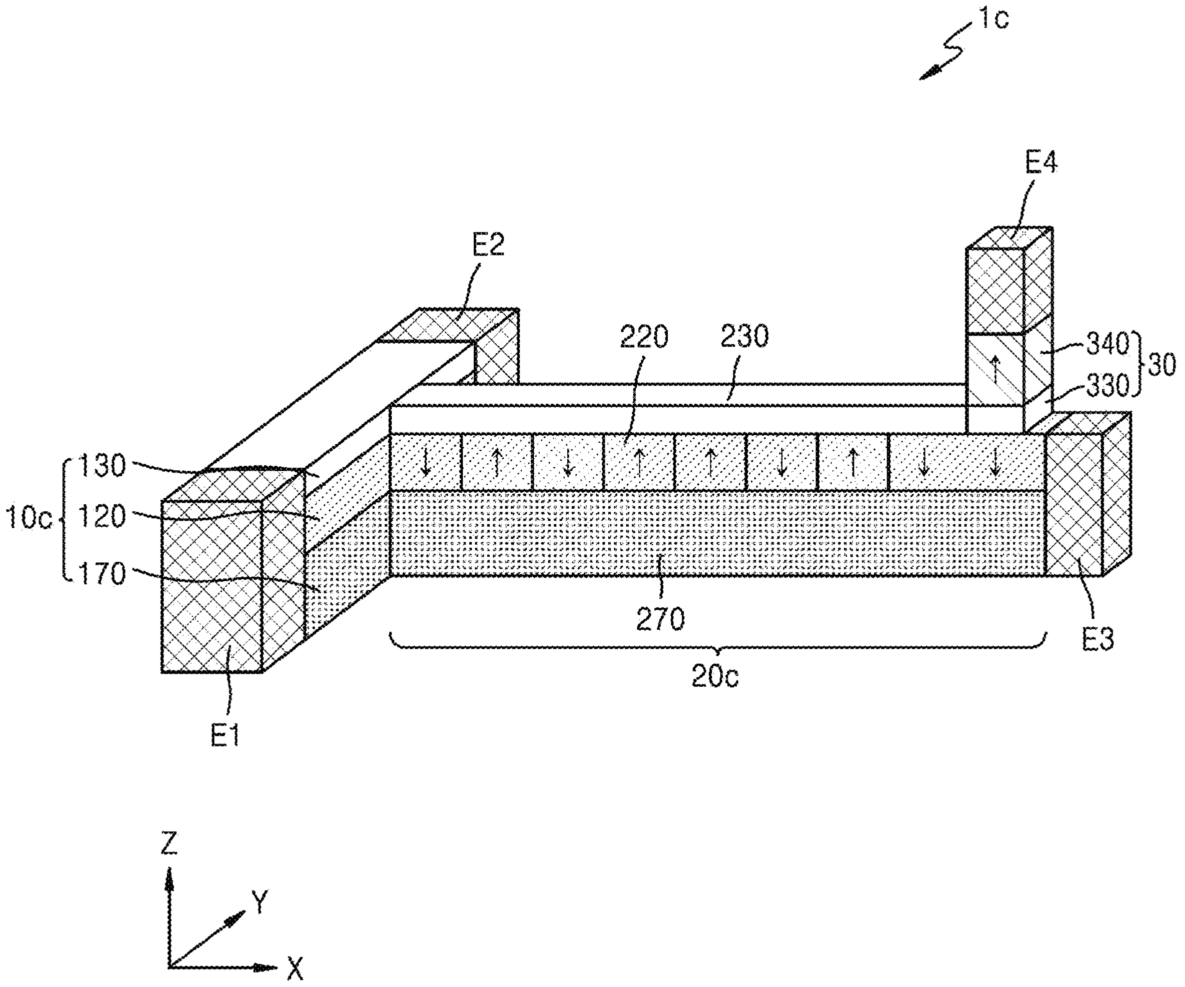
FIG. 11 is a perspective view of a racetrack memory device including the writing element of FIG. 10.

FIG. 10 is a cross-sectional view of a writing element 10*c* according to another embodiment. FIG. 11 is a perspective view of a racetrack memory device 1*c* including the writing element 10*c* of FIG. 10. Referring to FIGS. 10 and 11, the writing element 10*c* may include a first antiferromagnetic layer 170, the first free layer 120, and the first oxide layer 130.

The first antiferromagnetic layer 170 may include a material that breaks symmetricity with respect to the magnetization direction of the first free layer 120 and simultaneously generates a spin current. The first antiferromagnetic layer 170 may include a material in which a magnetization direction in the +Y direction and a magnetization direction in the −Y direction are alternately aligned in the vertical direction. For example, the first antiferromagnetic layer 170 may be a metal layer of IrMn, PtMn, and the like.

An exchange bias field corresponding to the magnetization direction of the first antiferromagnet layer 170 is generated at an interface between the first antiferromagnetic layer 170 and the first free layer 120. In other words, the exchange bias field of the first antiferromagnetic layer 170 provides the same effect as an external magnetic field applied to the first free layer 120 so that the magnetization direction of the first free layer 120 is inclined in the horizontal direction (e.g., the +Y direction or the −Y direction). In this state, when the first current is applied to the first antiferromagnetic layer 170, magnetization switching is generated in the first free layer 120 by the spin current generated in the first antiferromagnetic layer 170 so that a magnetic domain may be created.

A moving element 20*c* may include a second antiferromagnetic layer 270, the second free layer 220, and the second oxide layer 230. The second antiferromagnetic layer 270, the second free layer 220 and the second oxide layer 230 may correspond to the first antiferromagnetic layer 170, the first free layer 120, and the first oxide layer 130, respectively. The second antiferromagnetic layer 270, the second free layer 220, and the second oxide layer 230 may be formed integrally with the first antiferromagnetic layer 170, the first free layer 120, and the first oxide layer 130, respectively.

The intensity of the second voltage applied to the writing element 10*c* and the moving element 20*c* may be less than the intensity of the first voltage applied to the writing element 10 10*c*. For example, the intensity of the second voltage may be ½ or less, ⅕ or less, or 1/10 or less of the intensity of the first voltage. Alternatively, the intensity of the second voltage may be a Gilbert damping constant multiple or less of the intensity of the first voltage. As the intensity of the second voltage is less than the intensity of the first voltage, the exchange bias fields by the first and second antiferromagnetic layers 170 and 270 do not affect the injection and movement of the magnetic domain. Accordingly, the spin currents generated by the second current in the first and second antiferromagnetic layers 170 and 270 may move the magnetic domain. As the method in which the moving element 20*c* moves the magnetic domain is described above, a detailed description thereof is omitted.

The racetrack memory devices 1, 1*b*, and 1*c* according to the embodiments may be used for a memory device. In particular, as selective magnetization switching of the first free layer 120 is possible without application of an external magnetic field, a high speed operation may be possible without having to be equipped with a complicated structure to apply an external magnetic field. In the racetrack memory devices 1, 1*b*, and 1*c* according to the embodiments, as the writing elements 10, 10*a*, 10*b*, and 10*c* to create a magnetic domain is separated from " " the movement elements 20, 20*a*, 20*b*, and 20*c* to store a magnetic domain, different power may be used for the creation and storage of a magnetic domain so that power efficiency may be improved. Furthermore, as the size of a magnetic domain may be adjusted by the pulse size of the second current, the capacities of the racetrack memory devices 1, 1*b*, and 1*c* may be flexibly adjusted.

Figure 12:
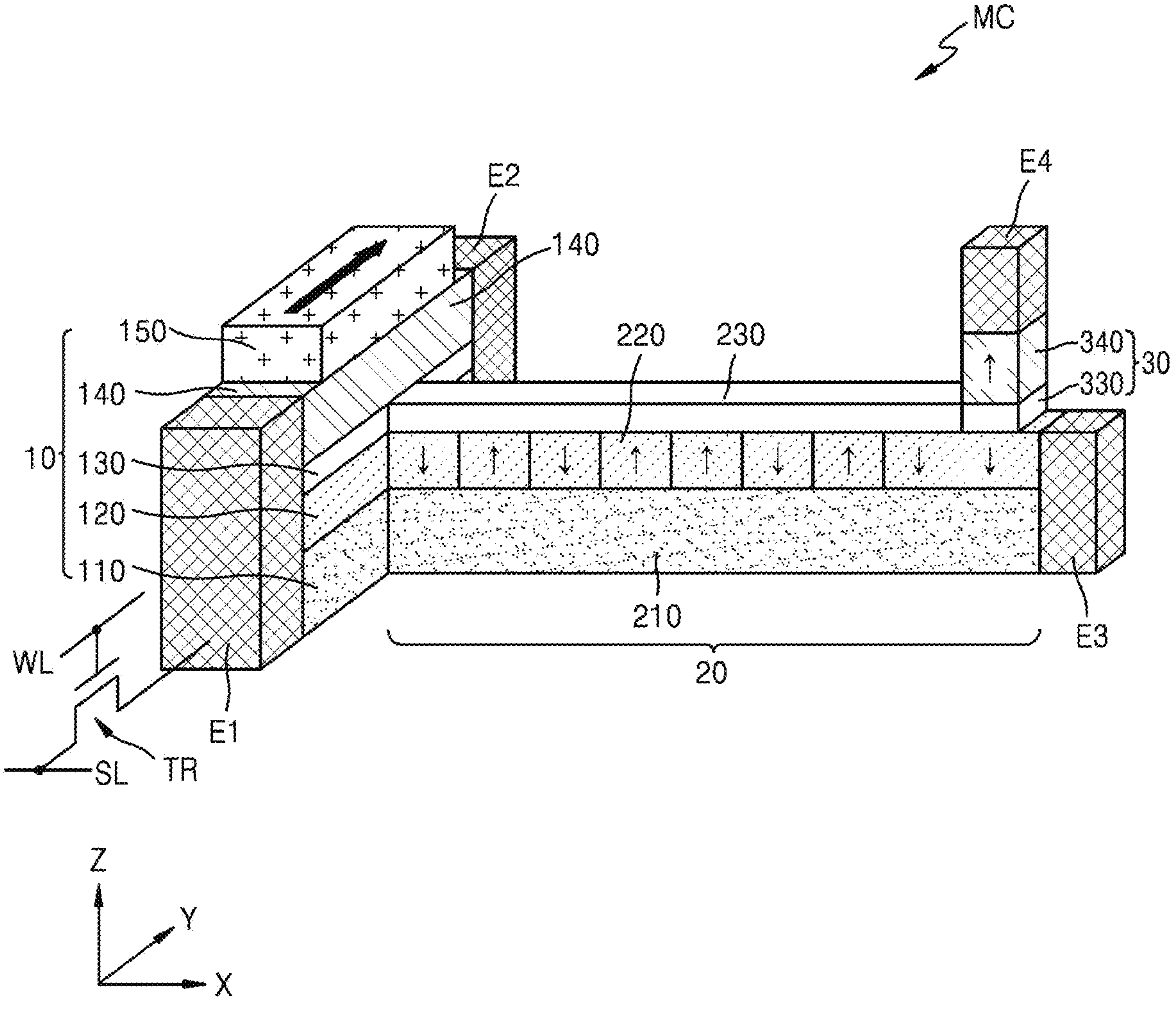
FIG. 12 is a schematic perspective view of one memory cell including a racetrack memory device according to an embodiment.

FIG. 12 is a schematic perspective view of one memory cell including the racetrack memory device 1 according to an embodiment. Referring to FIG. 12, a memory cell MC may include the racetrack memory device 1 and a switching device TR connected thereto. The switching device TR may be a thin film transistor. The memory cell MC may be connected between a bit line BL (not shown) and a word line WL. The bit line BL and the word line WL may be arranged to intersect with each other, and the memory cell MC may be located at an intersection thereof. The bit line BL may be electrically connected to the fourth electrode E4 of the racetrack memory device 1 (100), and the word line WL may be connected to a gate of the switching device TR. Furthermore, first source/drain electrodes of the switching device TR may be electrically connected to the second electrode E2 of the racetrack memory device 1, and second source/drain electrodes thereof may be electrically connected to a source line SL. In such a structure, a write current and a read current may be applied to the memory cell MC through the word line WL and the bit line BL. The racetrack memory devices 1*ba* and 1*c* according to some embodiments may also be applied to the memory cell MC.

Figure 13:
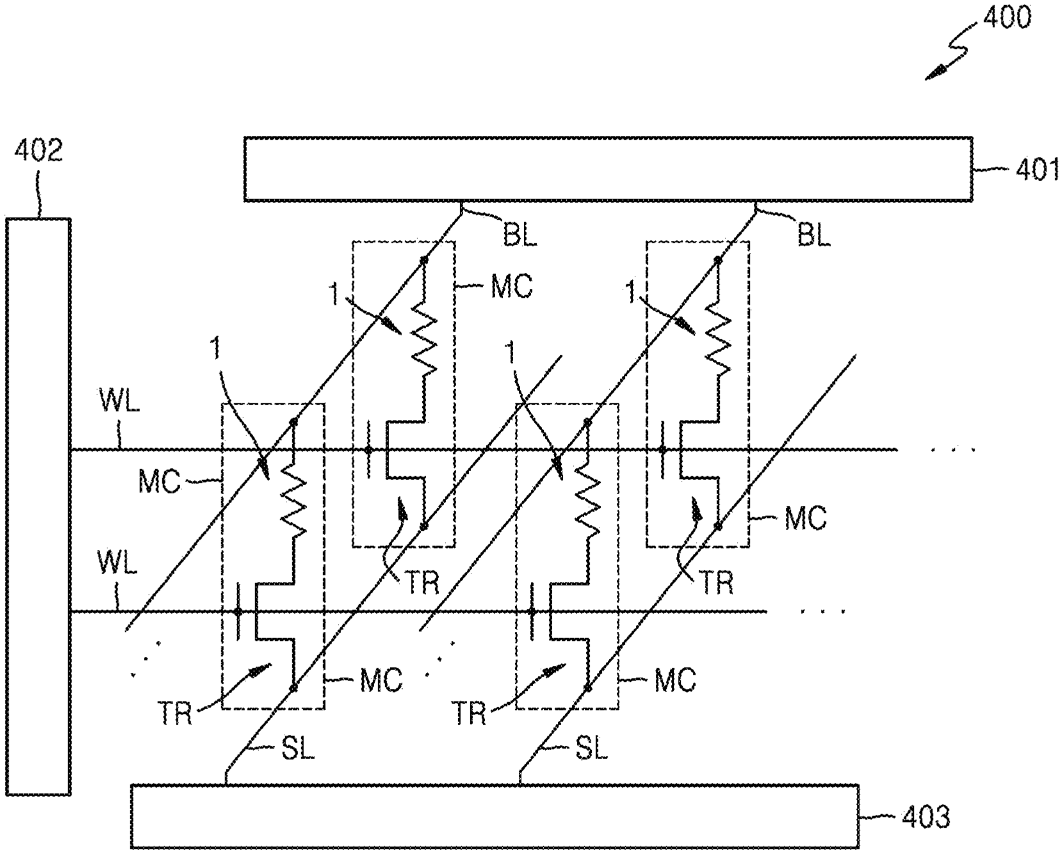
FIG. 13 is a circuit diagram schematically showing a configuration of a memory device including a plurality of memory cells of FIG. 12.

FIG. 13 is a circuit diagram schematically showing a configuration of a memory device 400 including a plurality of memory cells of FIG. 12. Referring to FIG. 13, the memory device 400 may include a plurality of bit lines BL, a plurality of word lines WL, a plurality of source lines SL, a plurality of memory cells MC, each being located at each of intersections between the bit lines BL and the word lines WL, a bit line driver 401 that applies a current to the bit lines BL, a word line driver 402 that applies a current to the word lines WL, and a source line driver 403 that applies a current to the source lines SL. Each memory cell MC may have a configuration illustrated in FIG. 12. The memory device 400 illustrated in FIG. 13 may be, for example, a magnetic random access memory (MRAM), and may be used for electronic devices using a non-volatile memory.

Figure 14:
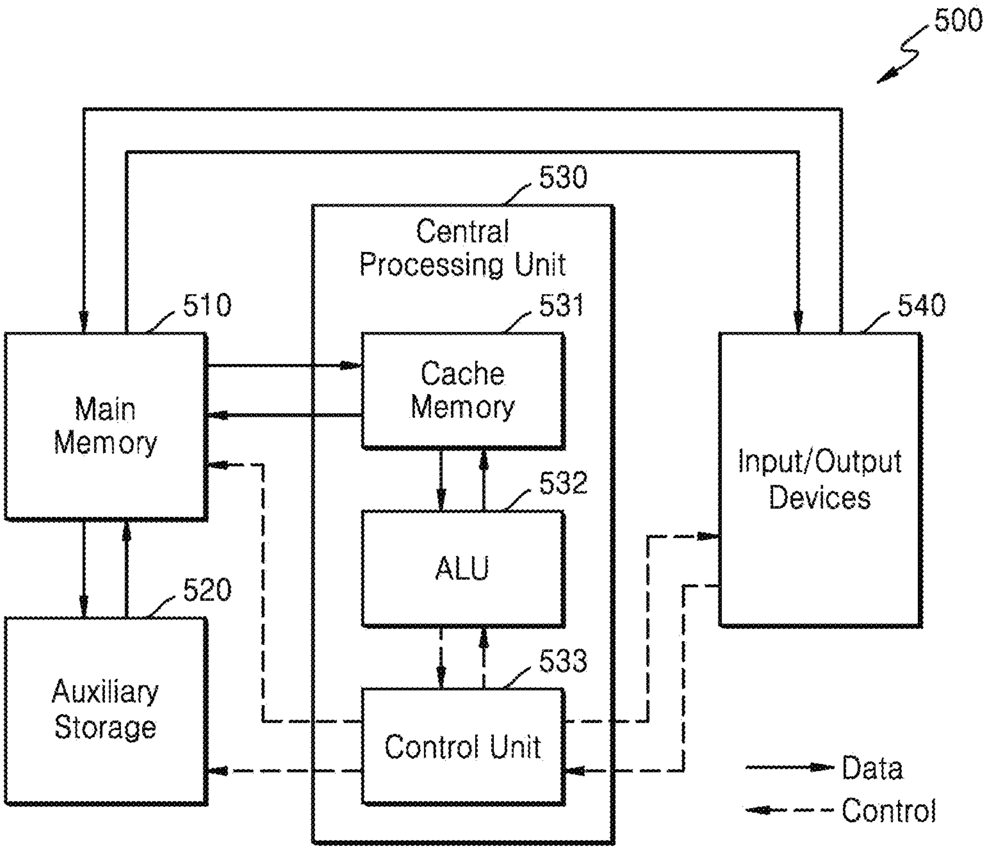
FIG. 14 is a conceptual view schematically showing a device architecture applicable to an electronic device according to embodiments.

The memory device 400 described above may be used to store data in various electronic devices. FIG. 14 is a conceptual view schematically showing a device architecture applicable to an electronic device 500 according to embodiments. Referring to FIG. 14, the electronic device 500 may include a main memory 510, an auxiliary storage 520, a central processing unit (CPU) 530, and input/output devices 540 (e.g., keyboard, display). The CPU 530 may include a cache memory 531, an arithmetic logic unit (ALU) 532, and a control unit 533. The cache memory 531 may include a static random access memory (SRAM). The main memory 510 may include a DRAM device, and the auxiliary storage 520 may include the memory device 400 according to an embodiment. Alternatively, the cache memory 531, the main memory 510, and the auxiliary storage 520 may all include the memory device 400 according to an embodiment. In some cases, the electronic device 500 may be implemented such that computing unit devices and memory unit devices are adjacent to each other in one chip without distinction of sub-units described above.

It should be understood that the racetrack memory device described above and the electronic device including the racetrack memory device described herein should be considered in a descriptive sense only and not for purposes of limitation. Descriptions of features or aspects within each embodiment should typically be considered as available for other similar features or aspects in other embodiments.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While one or more embodiments have been described with reference to the figures, it will be understood by those of ordinary skill in the art that various changes in form and details may be made therein without departing from the spirit and scope as defined by the following claims.

What is claimed is:

1. A racetrack memory device comprising:

a writing element extending in a first horizontal direction and configured to create a magnetic domain based on a first current applied to the writing element;

a moving element having a first end connected to the writing element, the moving element extending in a second horizontal direction, the second horizontal direction intersecting the first horizontal direction, the moving element configured to have the magnetic domain created in the writing element injected into the moving element based on a second current applied to the moving element; and a reading element on the moving element and configured to read the magnetic domain included in the moving element, wherein a width of the moving element is less than a width of the writing element, and wherein the writing element includes a first free layer extending in the first horizontal direction, the moving element includes a second free layer extending in the second horizontal direction, and a width of the first free layer in the second horizontal direction is greater than a width of the second free layer in the first horizontal direction.

2. The racetrack memory device of claim 1, wherein a ratio of the width of the writing element to the width of the moving element is 1.5 or more.

3. The racetrack memory device of claim 2, wherein the ratio of the width of the writing element to the width of the moving element is 5 or less.

4. The racetrack memory device of claim 1, wherein a ratio of a length of the writing element to the width of the moving element is 2 or more.

5. The racetrack memory device of claim 1, wherein the writing element is configured to create the magnetic domain so the magnetic domain has a magnetization direction corresponding to a direction of the first current.

6. The racetrack memory device of claim 1, wherein the writing element is configured to create the magnetic domain so the magnetic domain has a first magnetization direction if a direction of the first current applied to the writing element is parallel to the first horizontal direction, the writing element is configured to create the magnetic domain so the magnetic domain has a second magnetization direction if the direction of the first current applied to the writing element is opposite the first horizontal direction, and the second magnetization direction is opposite the first magnetization direction.

7. The racetrack memory device of claim 6, wherein if a first magnetic domain having the first magnetization direction is already in the writing element, the writing element is configured to change the magnetic domain in the writing element from the first magnetic domain to a second magnetic domain having the second magnetization direction if the direction of the first current applied to the writing element is opposite the first horizontal direction.

8. The racetrack memory device of claim 1, wherein a size of the magnetic domain injected into the moving element is based on a pulse width of the second current.

9. The racetrack memory device of claim 8, wherein the size of the magnetic domain injected into the moving element is proportional to the pulse width of the second current.

10. The racetrack memory device of claim 1, wherein an intensity of the second current is less than or equal to an intensity of the first current.

11. The racetrack memory device of claim 10, wherein the intensity of the second current is ½ or less of the intensity of the first current.

12. The racetrack memory device of claim 1, wherein a pulse width of the first current and a pulse width of the second current are equal.

13. The racetrack memory device of claim 1, further comprising:

a first electrode at a first end of the writing element;

a second electrode at a second end of the writing element, the second end of the writing element being opposite the first end of the writing element; and a third electrode connected to a second end of the moving element, the second end of the moving element being different than the first end of the moving element.

14. The racetrack memory device of claim 13, wherein the racetrack memory device is configured to apply the first current through the first electrode and the second electrode, and the racetrack memory device is configured to apply the second current through the third electrode while the first electrode and the second electrode are grounded.

15. The racetrack memory device of claim 1, wherein the writing element comprises a first spin-orbit torque layer configured to induce a first spin orbit torque based on the first current, the first free layer on the first spin-orbit torque layer and configured to create the magnetic domain based on the first spin orbit torque, a first oxide layer on the first free layer, an insulating layer on the first oxide layer, and a magnetic hard mask configured to form a magnetic field in an effective horizontal direction in the first free layer, and the moving element comprises a second spin-orbit torque layer configured to induce a second spin orbit torque by the second current, the second spin-orbit torque layer corresponding to the first spin-orbit torque layer, the second free layer on the second spin-orbit torque layer, the moving element being configured to inject the magnetic domain into the second free layer based on the second spin orbit torque, and a second oxide layer on the second free layer.

16. The racetrack memory device of claim 15, wherein the magnetic hard mask is on the insulating layer.

17. The racetrack memory device of claim 15, wherein the magnetic hard mask overlaps the first free layer and does not overlap the second free layer in a vertical direction, and the vertical direction intersects the first horizontal direction and the second horizontal direction.

18. The racetrack memory device of claim 15, wherein the magnetic hard mask comprises a first magnetic hard mask and a second magnetic hard mask that are apart from each other in the first horizontal direction.

19. The racetrack memory device of claim 1, wherein the writing element comprises a first ferromagnet layer having horizontal magnetic anisotropy, a first spin-orbit torque layer on the first ferromagnet layer and configured to induce a first spin orbit torque based on the first current, and the first free layer on the first spin-orbit torque layer and configured to create the magnetic domain based on the first spin orbit torque, and the moving element comprises a second ferromagnet layer on a same plane as the first ferromagnet layer, a second spin-orbit torque layer on the second ferromagnet layer and configured to induce a second spin orbit torque, and the second free layer on the second spin-orbit torque layer, the moving element being configured to inject the magnetic domain into the second free layer based on the second spin orbit torque.

20. The racetrack memory device of claim 1, wherein the writing element comprises a first antiferromagnetic layer configured to create a first spin current with an exchange bias field based on the first current, and the first free layer on the first antiferromagnetic layer and configured to create the magnetic domain with the exchange bias field based on the first spin current, and the moving element comprises a second antiferromagnetic layer on a same plane as the first antiferromagnetic layer and configured to create a second spin current based on the second current, and the second free layer on the second antiferromagnetic layer, the moving element being configured to inject the magnetic domain into the second free layer based on the second spin current.

* * * * *